United States Patent [19]
Shih et al.

[11] Patent Number: 5,824,567
[45] Date of Patent: Oct. 20, 1998

[54] METHODS FOR WAVELENGTH DISCRIMINATION OF MONOCHROMATIC LIGHT BEAMS

[76] Inventors: Ishiang Shih, 3300 Bahama St., Brossard, Quebec, Canada, J4Z 2R4; Linh Ngo Phong, 1035 Viger, Sante Foy, Quebec, Canada, G1W 2P8; Cindy Xing Qiu, 6215 Bienville St., Brossard, Quebec, Canada, J4Z 1W6; Philips Laou, 4980 Longelier St., Montreal, Quebec, Canada, H1M 2A1

[21] Appl. No.: 679,382

[22] Filed: Jul. 9, 1996

Related U.S. Application Data

[62] Division of Ser. No. 310,329, Sep. 22, 1994, Pat. No. 5,703,357.

[30] Foreign Application Priority Data

Sep. 27, 1993 [CA] Canada .................................. 2107062

[51] Int. Cl.$^6$ ................................................. H01L 21/00
[52] U.S. Cl. .................. 438/73; 438/57; 438/98
[58] Field of Search ................ 438/57, 59, 60, 438/61, 66, 67, 71, 72, 73, 74, 75, 80, 81, 98

[56] References Cited

U.S. PATENT DOCUMENTS

| | | | |
|---|---|---|---|
| 4,593,304 | 6/1986 | Slayman et al. | 257/457 |
| 4,826,777 | 5/1989 | Ondrids | 438/80 |
| 4,933,542 | 6/1990 | Bokor et al. | 257/440 |
| 4,998,154 | 3/1991 | Surridge et al. | 257/457 |
| 5,461,246 | 10/1995 | Chou | 257/449 |
| 5,494,833 | 2/1996 | Martin et al. | 438/66 |
| 5,535,231 | 7/1996 | Lee et al. | 257/82 |

*Primary Examiner*—Michael Trinh

[57] ABSTRACT

Methods for wavelength determination of a monochromatic beam are described. The methods involve a detector unit containing at least one variable filter and at least one pair of photo detectors. The detectors have photo sensitive regions with their areas varying with the position in one direction. The wavelength for maximum transmission of the variable filter varies in the same direction. By comparing the photo current values from the two detectors, wavelength of the incident beam is determined. Methods to construct wavelength discrimination junction photo detector pair and double barrier photo detector pair are also given.

16 Claims, 15 Drawing Sheets

METHODS FOR WAVELENGTH DISCRIMINATION OF MONOCHROMATIC LIGHT BEAMS

This application is a division of application Ser. No. 08/310,329, filed Sep. 22, 1994, U.S. Pat. No. 5,703,357.

BACKGROUND OF THE INVENTION

1. Field of the Invention

The Government of Canada has certain right on this invention.

The invention relates generally to methods for wavelength determination of light beams. More specifically, the invention relates to wavelength determination of pulsed laser beams.

2. Description of the Prior Art

In modern warfare, a pulsed laser beam is often used by the enemy to target a tank, ship, air craft or strategic site and to guide the projectiles in attacking the above targets. Once the pulsed laser beam has been sent, the enemy's detection system will detect the reflected pulsed laser beam and analyze the delay to determine, for instance, the distance. Pulsed laser beams thus constitute threats in the battlefield. In order to avoid the enemy attack, a jamming means or counter attack means must be exercised before or immediately after the attack. To achieve this effectively, it is required to identify the wavelength of the pulsed laser beam. For instance, if the wavelength of the threatening pulsed laser beam is known, then a pulsed laser tuned at the same wavelength can be switched on to emit pulses to confuse the enemy laser detection system. Alternatively, a counter attack means equipped with a laser beam seeking apparatus tuned at the enemy laser wavelength may be launched to destroy the enemy laser and detection system.

Spectral measurements of optical sources are generally made in three ways: a) using an interferometer, b) using a dispersing device and c) using a filter device. Methods using the interferometer usually require delicate apparatus and precise motion of mirrors for the determination of wavelengths. Some of the examples using the interferometer are given in U.S. Pat. Nos. 4,173,442, 4,329,055 and 5,168,324. Most methods involving interferometers have several drawbacks which prevent their use in practical fields, for instance, for the wavelength discrimination of single pulses or repetitive pulses. These drawbacks include: a) the requirements of precise motion for the mirrors, b) the incident angle of the beam must be known or adjusted with respect to the interferometer, c) the equipment used is bulky. Methods involving the dispersing device or filter device for the laser spectral determination usually require an array of optical detectors, each connected to an amplifying and multiplexing circuit. For methods involving optical filters for separating the wavelengths, an optical filter with a very narrow pass band corresponding to the wavelength value to be detected is mounted in front of a detector. In order to achieve the wavelength resolution, the number of narrow band pass filters and the number of optical detectors must be large, making the wavelength determination unit too bulky and too slow to react to the incident laser threats. Different spectral analysis units using integrated detector arrays have been proposed. For instance, the U.S. Pat. No. 5,166,755 issued on Nov. 24, 1992 to Gat disclosed a spectrometer apparatus. The Gat apparatus consists of an array of monolithic photosensitive elements and a linear variable filter (LVF) where the number of photosensitive elements is at least the number of wavelengths to be discriminated. Therefore, the resolution of the Gat spectrometer is limited by the number of photosensitive elements current technology can produce and the relatively long total data acquisition time required. Since the number of photosensitive elements is large, the Gat spectrometer may not function when used in the detection of single laser pulses or repetitive pulses. Since the detector array is fabricated on a planar substrate, a finite gap exists between adjacent detector elements. When the position of the LVF for the maximum transmission of the incoming light falls within this gap, the accuracy of the wavelength determination may be reduced considerably.

A unit for the discrimination of a pulsed laser beam has been disclosed in U.S. Pat. No. 5,225,894 issued on Jul. 6, 1993 to Nicholson, Parker, Mathur and Hull. The Nicholson et al unit consists of broadband filters, optical fiber delay lines with different delay times and detectors. An incoming pulsed laser beam is divided into different portions and each is guided through a delay line. Signals from all of the delay lines are collected and compared with the signals obtained without the delay lines. From the delay time and the transmission properties of the optical filter, the wavelength of the incoming pulsed laser beam is determined. Although the number of the detectors is reduced as compared to the Gat apparatus, optical fiber delay lines with different lengths must be employed in the Nicholson unit. In order to obtain a significant time delay for an unequivocal delay time determination, the length of the optical fibers must be relatively large and a complicated time counting circuit must be included in the unit, making the Nicholson unit too bulky to be used in various field applications. In addition to the above, the enemy may launch repetitive pulses with very short intervals between the pulses. In such conditions, it may not be possible to discriminate the wavelength of the laser threats using the Nicholson unit, which relies on counting the time delay of well defined pulses for the wavelength determination. Another drawback of the Nicholson et al method is that it may not easily be extended to other wavelength regions, such as 3–5 $\mu$m and 8–12 $\mu$m, due to the various constraints for the delay lines.

From the above comment, it is clear that there is a need to provide an efficient method for the discrimination of pulsed laser beams.

SUMMARY OF THE INVENTION

The present invention achieves pulsed laser wavelength discrimination without the need of a large number of optical detectors or optical fiber delay lines. The wavelength discrimination is achieved using a linear variable filter (LVF) and a pair of detectors. More particularly the present invention relaters to a method for detection and wavelength discrimination of a monochromatic light beam comprising the steps:

installing at least one detector pair consisting of a first photo detector with progressively increasing active area per unit distance in one direction and a second photo detector aligned with the first, with progressively decreasing active area per unit distance in said direction, installing at least one variable filter on top of said detector pair, the maximum transmission wavelength of said variable filter varying with distance in said direction, measuring a first photo current generated in said first photo detector due to illumination of said monochromatic light beam through said variable filter, measuring a second photo current generated in said second photo detector due to illumination of said monochromatic light beam through said variable filter, comparing value of said first photo current and value of said second photo current, determining wavelength of said light beam from variation of maximum transmission wavelength of said variable filter in said direction.

In addition, the present invention relates to a device for wavelength discrimination of a monochromatic light beam comprising:

at least one detection pair consisting of a photo detector with progressively increasing active area per unit distance in one direction and a second photo detector aligned with the first with progressively decreasing active area per unit distance in said direction;

at least one variable filter on top of said detector pair, the maximum transmission wavelength of said variable filter varying with distance in said direction; means to measure and compare photo currents generated in said first and second photo detectors due to illumination of said monochromatic light beam through said variable filter; and means to determine the wavelength of said light beam from variation of maximum transmission of said variable filter in said direction.

By aligning the LVF parallel to the two detectors and by detecting the photo current values from the two detectors subject to the incoming laser pulse, the amounts of photons falling on the two detectors are determined in a form of photo current. From the ratio of the photo current values from the two detectors, the position of the part of LVF which allows photons of the laser beam to transmit and thus the corresponding wavelength is found. The present invention, which does not require optical delay lines, can be conveniently used in the wavelength range 0.5–1.1 μm, 3–5 μm and 8–12 μm.

Since the method and device of the present invention accomplishes the wavelength discrimination of monochromatic light pulses without the need of a large number of narrow band pass filters and a large number of optical detectors, the time required to determine the wavelength is much shorter compared to prior art methods. Furthermore, the present invention operates even for pulses with very small time separation, which may often lead to inaccurate wavelength results or even disable the units involving optical delay lines.

One object of the present invention is to provide a method and device for the wavelength discrimination of monochromatic light beams.

Another object of the present invention is to provide a method to fabricate junction photo detector pairs for wavelength discrimination.

Yet another object of the present invention is to provide a method to fabricate double barrier photo detector pairs for the wavelength discrimination of light beams.

Figure 1:
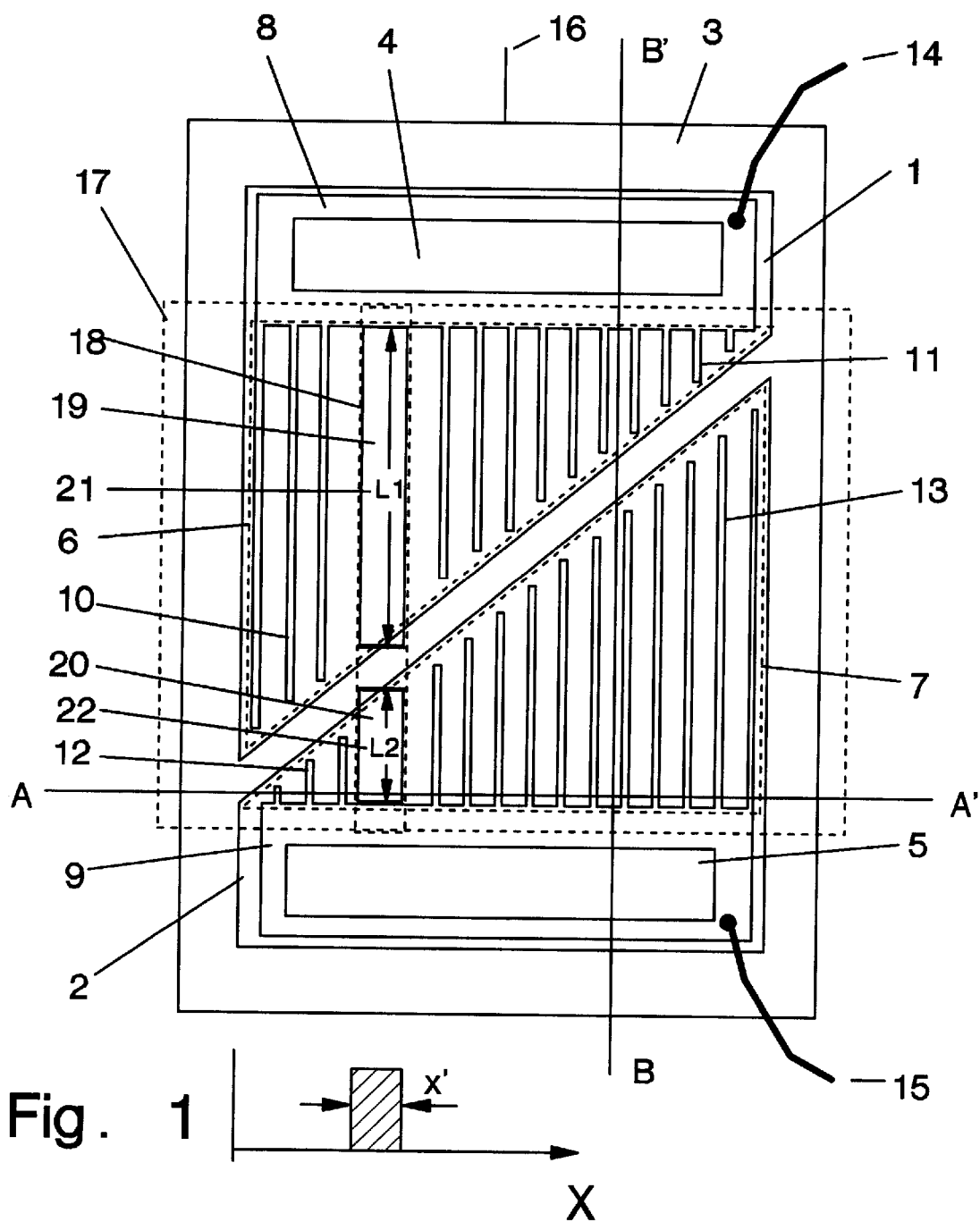
FIG. 1 is a schematic top view of a wavelength discrimination detector pair in accordance with the present invention.

While the invention will be described in conjunction with illustrated embodiments, it will be understood that it is not intended to limit the invention to such embodiments. On the contrary, it is intended to cover all alternatives, modifications and equivalents as may be included within the spirit and scope of the invention as defined by the appended claims.

DETAILED DESCRIPTION OF PREFERRED EMBODIMENTS

In the drawings, similar features have been given similar reference numerals.

The selection of a semiconductor for detector fabrication is determined by the frequency range to be sensed. For instance, Si can be used for the wavelength from 0.5 to 1.2 μm, InSb for 3 to 6 μm and HgCdTe for 6 to 12 μm. For clarity of description, the following description is made using Si semiconductor. It is understood that with some modifications, the methods provided in this invention can be easily extended to InSb, HgCdTe or other detector materials and even with different detector structures for operation in different wavelength regions. For instance, instead of using the simple p-n junction technology described below, one may employ the very well developed p-i-n photo detector technology or avalanche photo detector technology in order to obtain Si devices with a fast response time.

FIG. 1 shows a top view of the detector pair (1,2) for the wavelength discrimination. The detectors (1,2) are manufactured on a p-type Si semiconductor substrate (3) surface. An n-type Si substrate may well be used for the construction of similar detectors for operation in the range from 0.6 to 1.1 µm. The fabrication of the detector pair on the Si substrate shown in FIG. 1 follows very well developed processes used in the micro electronic industry. For those skilled in the art, it is sufficient to provide the main steps of the fabrication which includes: a) oxidation of the p-type substrate to form a layer of $SiO_2$ of about 1 µm thickness, b) cutting of two window regions defined by (1,2) and the removal of the $SiO_2$ from within the two regions by a photolithography process, c) diffusing of the donor impurities into the regions defined by (1,2) to form two n-type regions and thus two p-n junctions between (3) and (1), (3) and (2), d) oxidation to form a new layer of $SiO_2$ in the diffused regions (1,2), e) cutting of two rectangular windows (4,5) and two triangular windows (6,7) and the removal of $SiO_2$ from within the two regions for electrical contacts, f) deposition of an Al layer (thickness about 2 µm) in a vacuum system, carrying out photolithography and etching to remove unwanted Al to create two Al contact regions (8,9) which are electrically connected to fine grids (10–13 and those in between) and g) attachment of metal wires (14,15,16) to detector (1), detector (2) and the substrate (3). At least one semiconductor layer may be formed between said substrate and said diffused layer, said semiconductor layer having a resistivity at least 100 times greater than resistivity for said substrate to enhance generation of said photo current.

Figure 2:
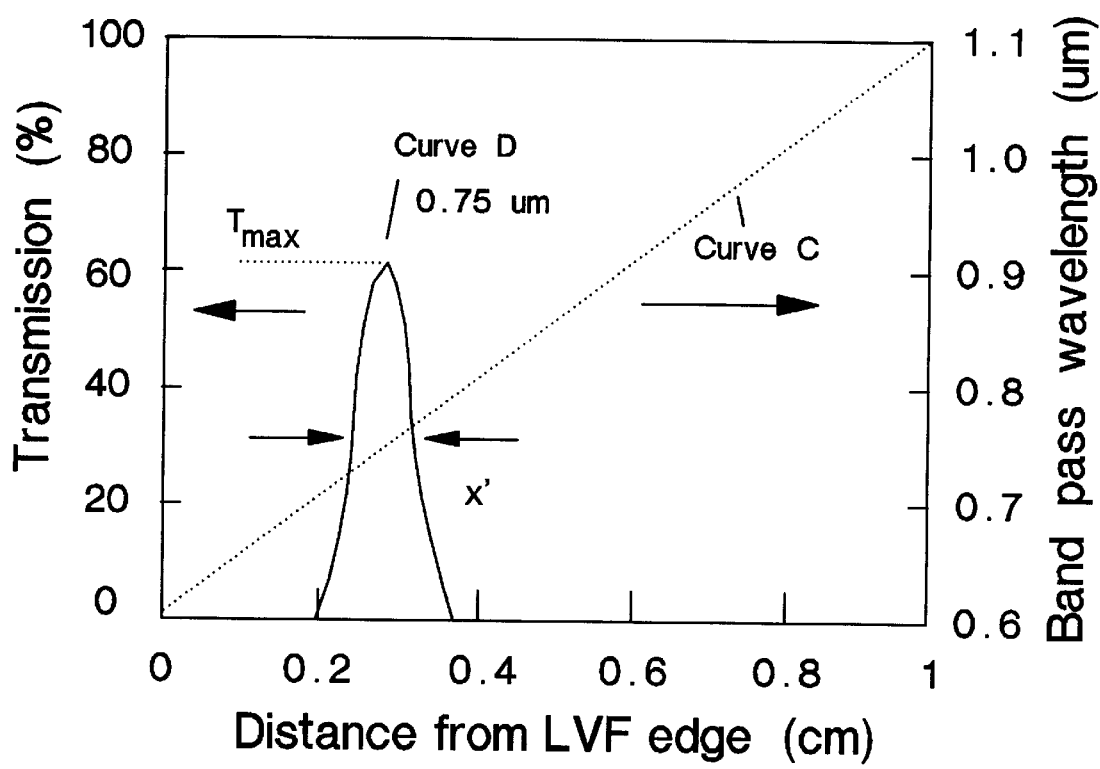
FIG. 2 is a graph showing the variation of band pass wavelength with the distance from the edge of a LVF.

It is noted that the fabrication of the above detectors is very similar to that for the fabrication of a Si photo voltaic cell except that the active regions (6,7) have a triangular shape. The length of the grids decreases from the left to the right for the detector (1) and increases for the detector (2) in this direction. For clarity of illustration, the number of grids (10,11,12,13) in the two detectors has been reduced and the spacing increased. To discriminate the laser wavelength, a linear variable filter (LVF) defined by the dotted rectangle (17) is disposed immediately on top of and parallel to the detector pair. Typical dimensions of the LVF are 1 cm in length and 0.5 cm in width for the wavelength range from 0.6 to 1.2 µm. Slightly larger dimensions are generally used for the wavelength ranges from 3 to 5 µm and from 8 to 12 µm. The transmission properties of the LVF (for operation in the range from 0.6 to 1.2 µm) along the A–A' direction are shown in FIG. 2. The band pass value increases from 0.6 µm to 1.2 µm as one travels from the left to the right along the path A–A' (see Curve C in FIG. 2). The transmission properties along the path B–B' are unchanged. For a given incident monochromatic light beam, such as a pulsed laser beam, the spatial transmission of the LVF is given by Curve D. It is noted that for a monochromatic light beam with a wavelength of 0.8 µm, the peak of transmission is located at 0.2 cm, corresponding to transmission value for the LVF given by Curve C.

The maximum transmission wavelength value of 0.8 µm and the width x' for half of the maximum transmission ($T_{max}$) at the wavelength of 0.8 µm is determined by combination and thickness variation of the layers used to form the LVF. The design principles of the LVF can be found in various publications, for instance in "Optical Thin Films—User's Handbook" by J. D. Rancourt, McGraw-Hill Optical and Electro-Optical Engineering Series. Since the transmission properties of the LVF along path B–B' are constant, photons in the monochromatic light beam will penetrate the narrow region denoted by the dotted rectangle (18) in FIG. 1. Outside this dotted region (18) light will either be absorbed or reflected by the LVF. For an incident beam with a uniform spatial distribution, the number of photons falling on detector (1) is proportional to the active area (19) in detector (1) enclosed by the rectangle (18). The number of the photons falling on detector (2) is proportional to the active area (20) in detector (2) enclosed by the same dotted rectangle (18). The active area (19) in detector (1) enclosed by the rectangle (18) is proportional to the average length (21) of the area. The active area (20) in detector (2) enclosed by the same dotted rectangle (18) is proportional to another average length (22) of the area.

From the shape of active areas of the two detectors, the average lengths (21,22) can easily be determined by knowing the position of the filter region which yields the maximum transmission for the incident monochromatic light beam. For the two inverted and aligned detectors in pair with triangular active areas, ratio of the average lengths of active areas (21)/(22) or (22)/(21) is a monotonic function of the distance, X. In the actual wavelength determination, the LVF with the known band pass variation (Curve C, FIG. 2) is aligned with the detector pair. When a monochromatic light beam with an unknown wavelength is incident on the detector pair, values of photo currents $I_1$ and $I_2$ from the detectors (1) and (2) respectively are measured and the ratio of the two photo current values is used to determine the ratio of average lengths of the two active regions, (22)/(21).

Once the ratio of the average lengths (22)/(21) has been given, the position of the LVF with the maximum transmission for the incident monochromatic light beam can be determined. From Curve C given in FIG. 2, the corresponding wavelength for the incident light beam can be found.

For precise wavelength determination using the above described method, it may be necessary to take into account the possible variation of photo current collection efficiency (∩) for different active regions along the X direction. For detector (1) near to X=0, the length of the metal grids is large. Due to the finite resistance of the metal grids, some of the charge carriers excited by the incident photons may not be collected. On the other hand, the length of grids in the region near X=1 cm in detector (1) is small. Therefore, the resistance due to the fine grids is small and the collection efficiency of charge carriers excited by the incident photons in this region is large. In areas between the extreme regions, the collection efficiency falls between the collection values in these two regions. Since the photo carrier collection efficiency (∩) at a given position on the active area of the detectors (1,2) is a complex function of the doping concentrations in the p- and n-regions, junction depth, depletion width, mobilities, life times of charge carriers in the p- and n-regions and width, spacing and length of the fine metal grids, it is more convenient to carry out a calibration of the photo current collection efficiency for detectors fabricated under given conditions.

The calibration includes the following steps: a) preparing an opaque mask with a rectangular window with a width equal to x', the width for half the maximum of the transmission of the LVF to be used, b) aligning the mask to the detector pair with the long axis of the rectangular window parallel to the direction B–B' and adjusting the position, X, c) illuminating the detector pair with a monochromatic light pulse having a wavelength corresponding the band pass value of the LVF at position X, d) measuring the photo currents from the two detectors (1,2), e) taking the ratio of the measured photo currents and the average active region length (21) or (22), f) varying the wavelength of the light beam and repeating steps a) to e), g) plotting the ratio of photo current and average active region as a function of distance, X. The data obtained from the above steps is stored in a process for the wavelength discrimination.

In order to increase the sensitivity and resolution for the wavelength discrimination, the number of active regions (and thus the metal fingers) within the width x' for half of the maximum transmission ($T_{max}$) at a given wavelength must be large. This can be easily accomplished for the relatively large value of x', which is in the order of mm for an ordinary LVF, and the relatively small widths of the metal fingers and detector active regions used. Metal grids and detector active regions (spacings between the grids) with widths in the order of 10 μm or less can be easily obtained using state of the art micro electronic fabrication technology. Therefore, a grid number of more than 10 can be conveniently achieved within the width x', for half of the maximum transmission ($T_{max}$) at the selected wavelength.

Figure 3:
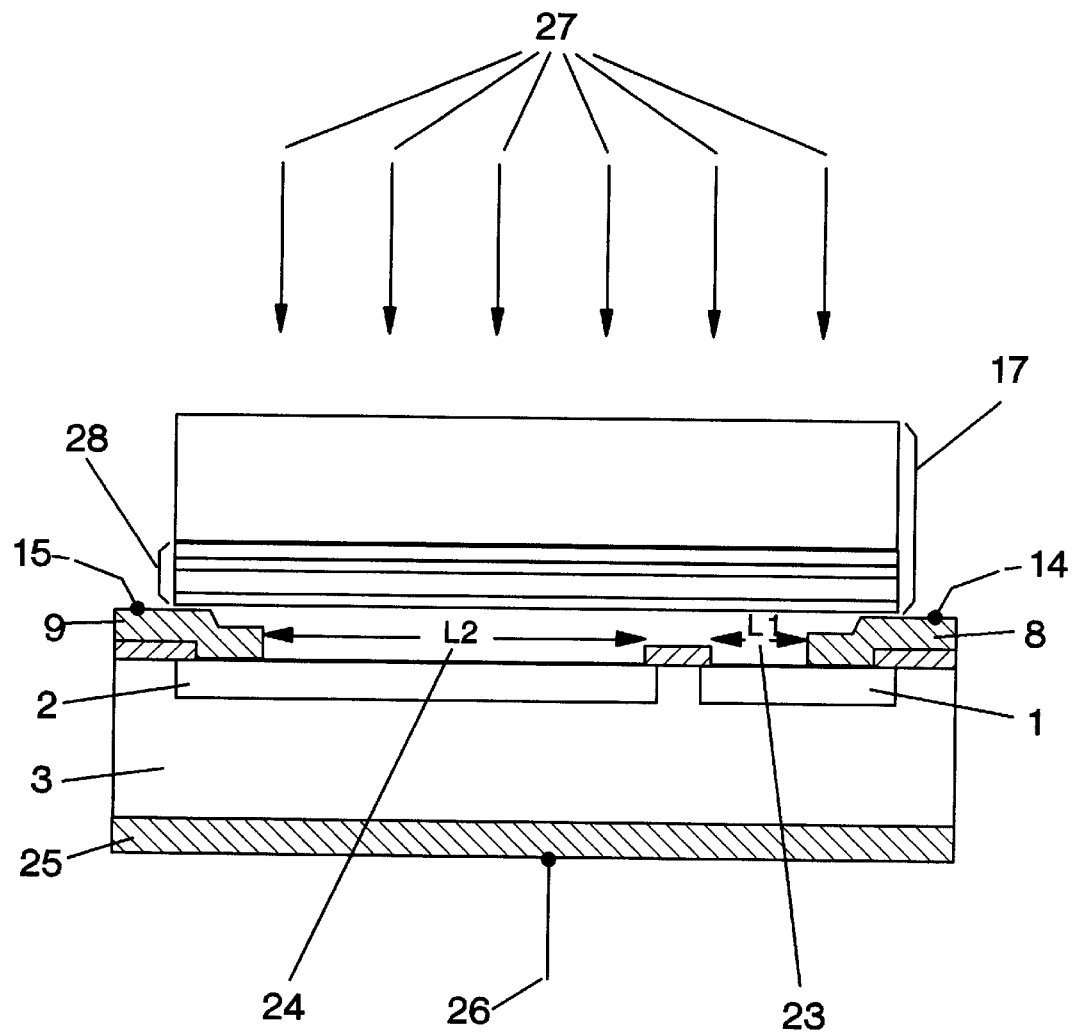
FIG. 3 is a schematic cross-sectional view of part of the detector and the linear variable filter (along line B–B') of FIG. 1.

The operation of the present invention can be better understood by referring to FIG. 3, which shows a schematic cross-sectional view of the detector unit including the detector pair (1,2) and the LVF (17) along path B–B' given in FIG. 1. Active region (23) of detector (1) is the region not covered by the metal contact (8), which is opaque. The active region (24) of detector (2) is the region not covered by the metal contact (9). An ohmic back metal contact layer (25) is deposited by vacuum evaporation so that electrical signals can be taken from an electrical wire (26) attached to it.

For detector (1), the electrical signal is measured between (14) and (26), whereas for detector (2) the signal is taken between (15) and (26). When a light beam (27) is incident on the detector unit, it is first filtered by the multilayer coating (28) of the LVF (17). As the wavelength of the incident beam coincides with the maximum transmission of a section of the LVF, most of the photons will be allowed to go through the LVF to reach the active areas (23,24) of the two detectors (1,2). Since the area of active region (23) is proportional to the average length ($L_1$) and the area for the active region (24) is proportional to the average length ($L_2$), the value of photo current due to the incident light beam from detector (1) will be proportional to $L_1$, while the photo current value from the detector (2) will be proportional to $L_2$. Therefore, by measuring the photo current values from the two detectors (1,2) and calculating their ratio, the position of the LVF permitting the maximum transmission of the incident light beam can be determined. From this ratio, the corresponding wavelength of the incident light beam is easily obtained, knowing the relation of the peak transmission wavelength and the position of the LVF.

Figure 4:
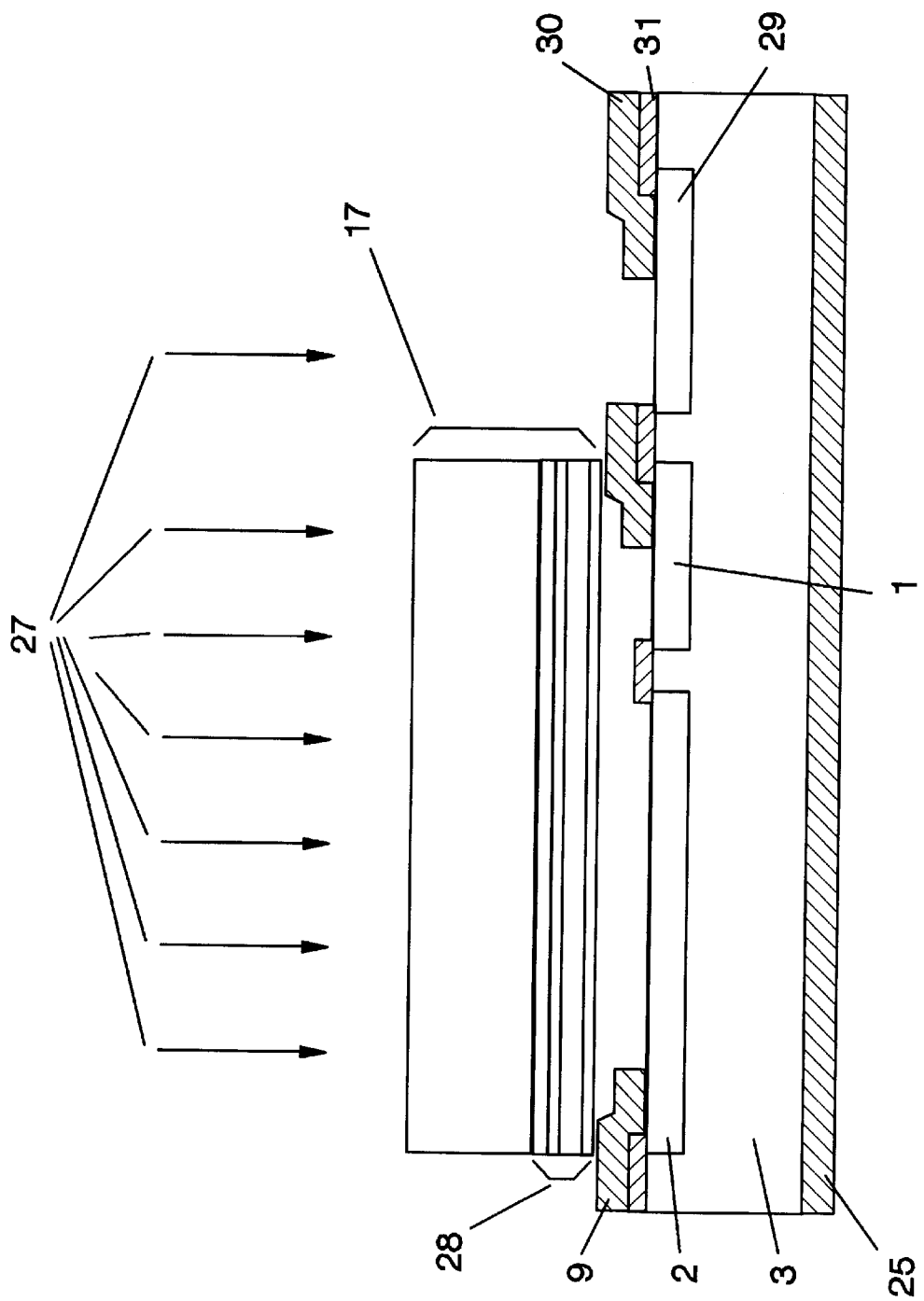
FIG. 4 is a schematic cross-sectional view of a further embodiment of detector pair with a trigger detector.

Since only a small portion of either detector (1) or (2) is illuminated under a monochromatic light beam, the photo current value may be relatively small. The corresponding voltage which can develop across a resistor connected in parallel to the detector is also small. This relatively small photo current or voltage may not be sufficient to serve as a trigger signal for a sample and hold circuit which is required for fast data acquisition. In order to obtain a higher photo current or voltage, a third detector can be incorporated. A cross-sectional view of the detector unit with the third detector is shown in FIG. 4. Here, in addition to the two detectors (1,2) which form a pair, the third detector (29) is incorporated. Part of the detector (29) is covered by $SiO_2$ (31) and Al metal layer (30). The electrical signal from the third detector (29) is taken between (30) and (25). Unlike (1) and (2), the third detector (29) is not covered by the LVF (17) so that the photo current per unit active area from the third detector will be much larger than that from the former detectors. The signal, in the form of a voltage pulse from the third detector can thus be used effectively for triggering of data acquisition circuits even under moderate illumination.

Figure 5:
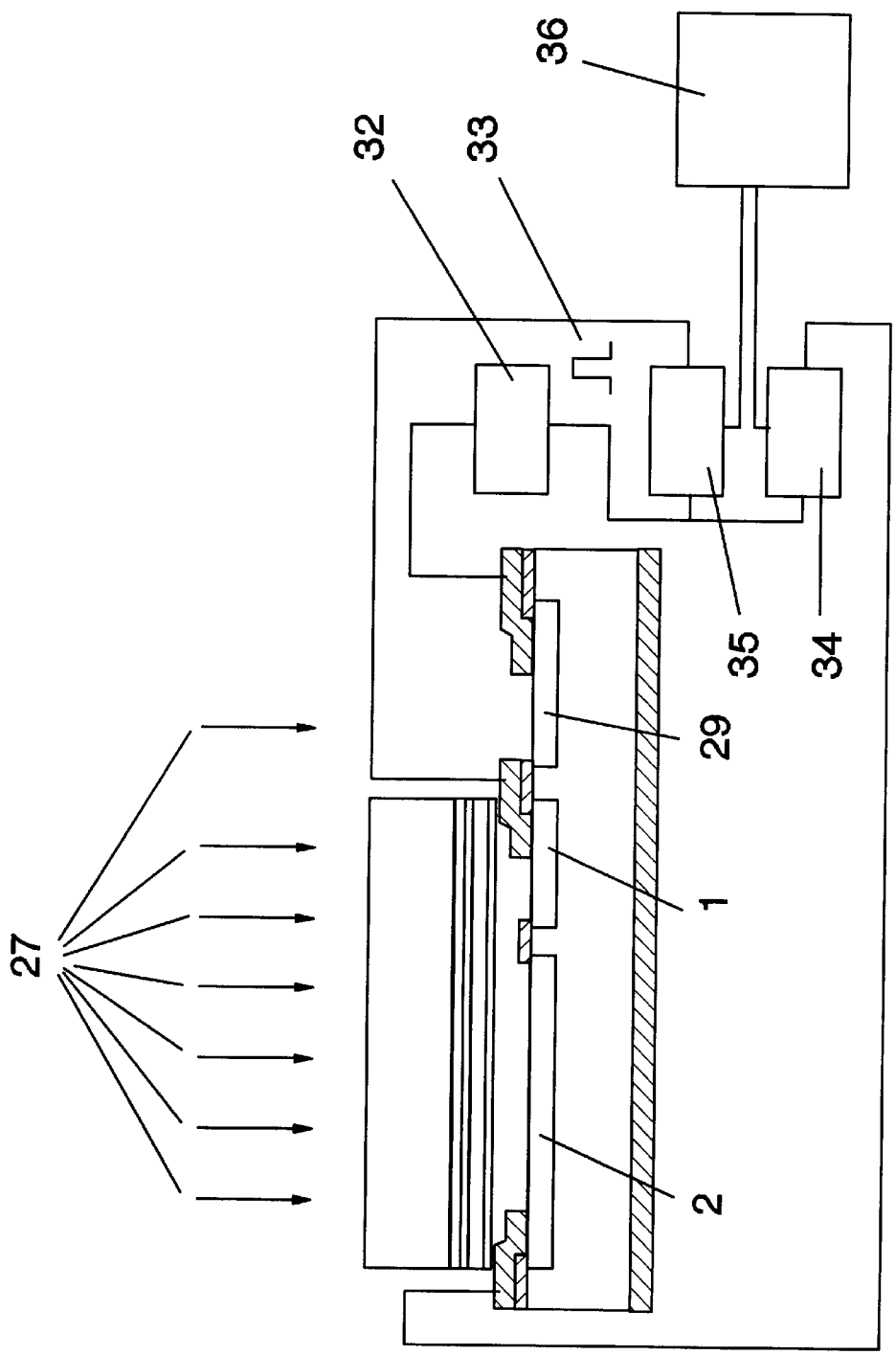
FIG. 5 is a schematic diagram of an example wavelength discrimination circuit for use with the detector pair and trigger detector of FIG. 4.

To operate the wavelength discrimination unit of FIG. 4, it is connected to an electronic circuit and a processor as shown in FIG. 5. When a monochromatic light pulse (27) is incident on the detector unit, electrical signals are generated simultaneously in the three detectors (1,2,29). The electrical pulse signal from detector (29) is fed to an amplifier circuit (32) with an appropriate filter. The filtered and amplified signal from the amplifier circuit (32) is fed to two sample and hold circuits (34,35). The electrical signal due to the incident light pulse from detector (1) is connected to the first sample and hold circuit (34) while the signal from detector (2) is connected to the second sample and hold circuit (35). A processor (36) continuously monitors the signal levels ($V_1$ from detector (1) and $V_2$ from detector (2)) from the two sample and hold circuits and retrieves the signals (voltage values). The signal levels are stored in the memory of the processor. After the above, the processor sends a signal to the two sample and hold circuits to clear the signals held in the sample and hold circuits.

If one or both of the signal levels is above a predetermined threshold value, the magnitudes of $V_1$ and $V_2$ are compared and ratio of $V_1/V_2$ is taken. The ratio is then multiplied by the correction factor (stored in the memory of the processor) determined by the collection efficiencies of the two detectors. The result is used to determine the position, X, of the portion of the LVF which gives the maximum transmission of the incident monochromatic light. The corresponding wavelength of the incident monochromatic light beam is found from the ratio, knowing the relationship between the wavelength for maximum transmission and the position, X. After the wavelength determination, the processor displays the wavelength using a visual display or an audio display. The processor continues the monitoring for the next incoming pulsed light beam.

Figure 6:
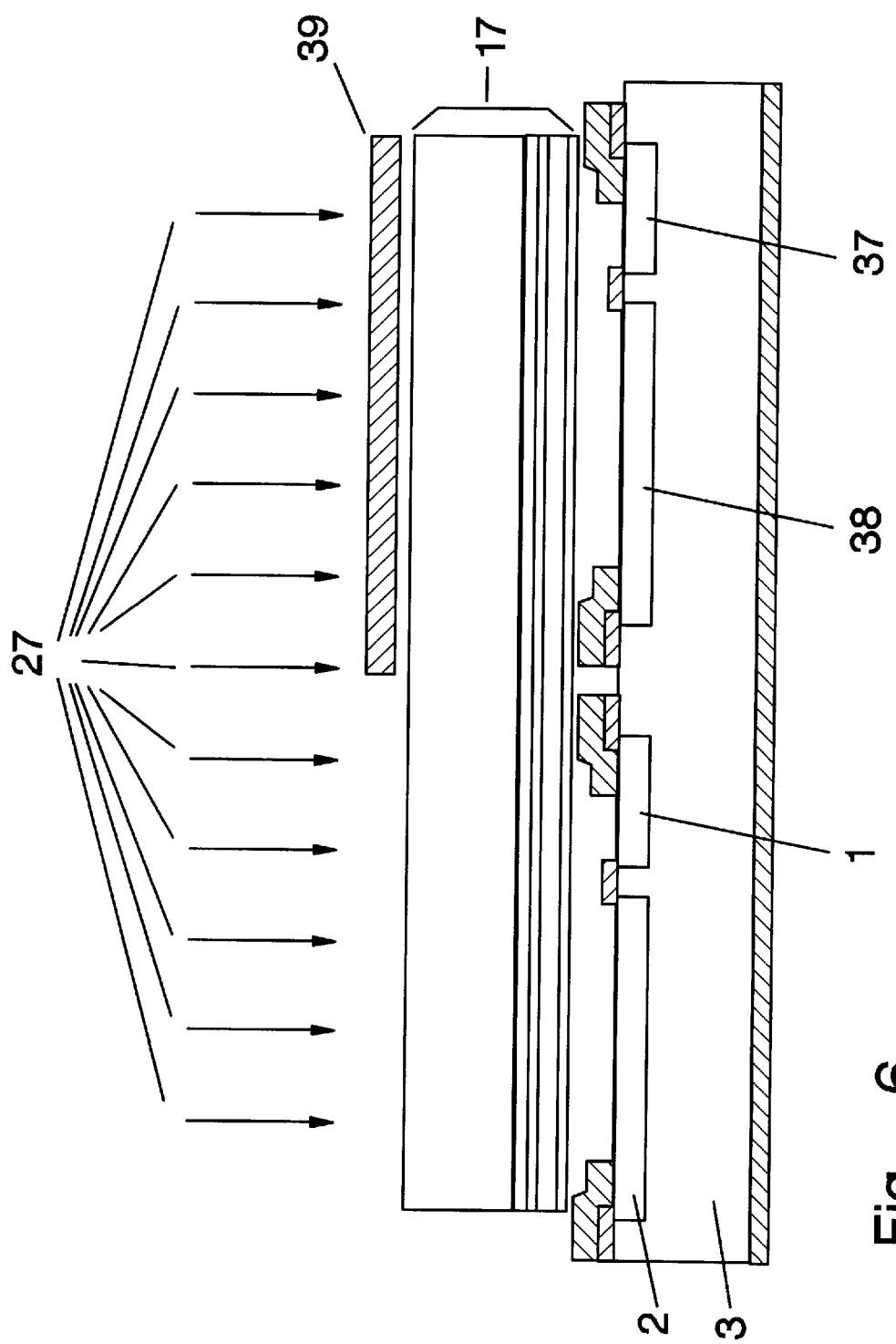
FIG. 6 is a schematic cross-sectional view of an alternative embodiment of the present invention featuring two detector pairs with a neutral filter over one of the pairs to increase the dynamic power range.

There can be a situation when the intensity of the incident monochromatic light is so high that one or both of the detectors (1,2) reaches a saturation condition. When this occurs, the ratio of the voltages from the two detectors $V_1/V_2$ for the light wavelength determination may not be correct. To overcome this problem, additional detector pairs can be incorporated in the detector unit. To simplify the explanation, a detector unit containing two detector pairs but without the detector for triggering is shown in FIG. 6. Here, in addition to the two detectors (1,2) which form the first detector pair, another two detectors (37,38), which form the second detector pair, are fabricated on the same semiconductor substrate (3). The first detector pair is aligned side by side with the second one. The dimensions and optoelectric properties of detectors (37,38) are the same as the dimensions and properties of the detectors (1,2).

The LVF (17) is disposed on the semiconductor substrate containing the four detectors to form a new detector unit so that the incident light (27) can go through the LVF and reach detector pairs (1,2) and (37,38) simultaneously. A neutral optical attenuator (39) for operation in the wavelength range of interest is installed on the LVF (17) and covers detectors (37,38). Detectors (1,2) are not covered by the neutral attenuator (39). The neutral attenuator is selected so that the transmission of light in the wavelength range of interest is in the 1–10% range. When an incident light beam falls on the detector unit, sample and hold circuits connected to the four detectors (1,2,37,38) will be triggered to sample and hold the photo voltage values from the detectors. A processor similar to processor (36) of FIG. 5, will monitor in a continuous manner the output voltages ($V_1$ for detector (1), $V_2$ for detector (2), $V_{37}$ for detector (37) and $V_{38}$ for detector (38) from the four sample and hold circuits connected to the four detectors. The voltage values will be stored in the memory of the processor.

As one or more of t he voltage values is greater than a predetermined value, the magnitudes of $V_1$ and $V_2$ are compared. If both $V_1$ and $V_2$ are less than a threshold value (which represents a saturation of the detectors when light of high intensity is incident on the detectors), the ratio of $V_1/V_2$ is taken. The ratio is then multiplied by the correction factor (stored in the memory of the processor) determined by the collection efficiencies of the two detectors and the result is used to determined the position, X, of the portion of the LVF which gives the maximum transmission of the incident monochromatic light. The corresponding wavelength of the incident monochromatic light beam is found from the ratio, knowing the relationship between the wavelength for maximum transmission and the position, X. After the wavelength determination, the processor displays the wavelength using a visual display or an audio display. The processor continues the monitoring for the next incoming pulsed light beam.

When either or both of $V_1$ and $V_2$ are greater than the threshold value representing the saturation of the detectors, values of $V_1$ and $V_2$ will not be used for the wavelength determination. Instead of $V_1$ and $V_2$, the processor will compare $V_{37}$ and $V_{38}$. Since both $V_{37}$ and $V_{38}$ are output voltages from the two detectors (37,38) covered by the neutral attenuator (39), the values will be at least 10 times smaller than what they should be from the detectors (1,2) without saturation. The ratio of $V_{37}/V_{38}$ is taken and the value is then multiplied by the correction factor determined by the collection efficiencies of the two detectors. The result is used to determined the position, X, of the portion of the LVF which gives the maximum transmission of the incident monochromatic light. The corresponding wavelength of the incident monochromatic light beam is found from the ratio, knowing the relationship between the wavelength for maximum transmission and the position, X. Using this arrangement with the second detector pair (37,38) under the attenuator (39), the dynamic range of the detector unit is increased. The dynamic power range for the wavelength discrimination can be increased further by incorporating more than one detector pair and neutral attenuator in the detector unit. After the wavelength determination, the processor display the wavelength using a visual display or an audio display. The processor continues the monitoring for the next incoming pulsed light beam.

Another method to increase the dynamic range of the detector unit without additional pairs of detectors is to adjust the gain of the amplifier in the sample and hold circuits. The gain of the amplifier is selected so that the maximum of the two voltages ($V_1$ and $V_2$) does not exceed the threshold value representing saturation of the detector. In this manner, the dynamic power range of the detector unit can be increased.

Simple p-n junction type detectors (1,2), which are formed by diffusion of n-type impurities into a p-type substrate, may not give the required response times for the detection of very fast laser pulses. To reduce to response times for the detectors, special detector structure configurations may be used. For instance, the detector pair can be manufactured using double Schottky barrier technology, p-i-n photo detector technology and avalanche photo detector technology. Since the structure of detectors fabricated using the double Schottky barrier technology is very simple and the performance is superior, the following description will concentrate on detector pair fabricated using this technology. General knowledge in this area is presented in various literatures such as: IEEE Transactions on Electronic Devices, Vol. ED-32, p. 1034 (1985), IEEE Journal of Quantum Electronics, Vol. QE-22, p. 1073 (1986) and Applied Physics Letters, Vol. 47, p. 1129 (1985).

Figure 7:
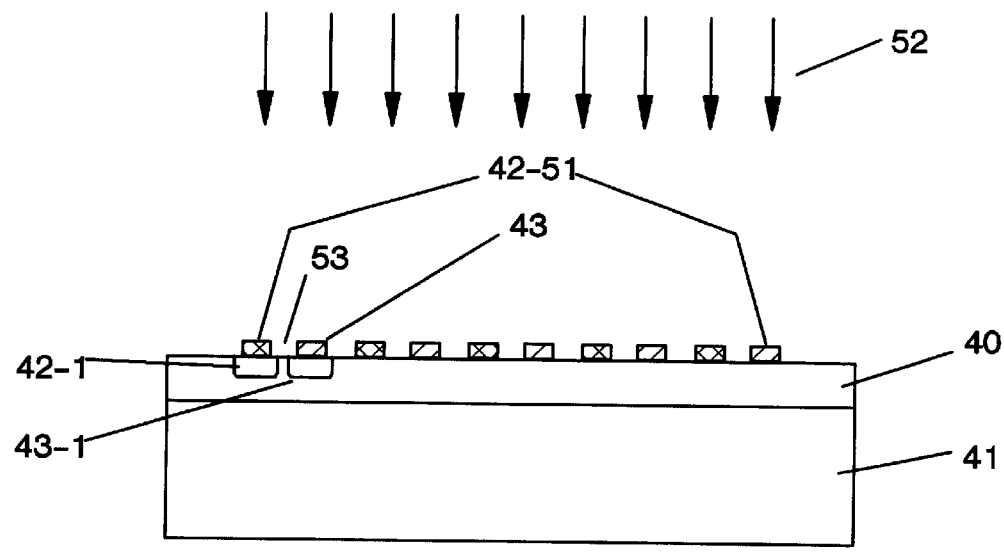
FIG. 7 is a cross-sectional view of an example embodiment of a double barrier inter digital photo detector in accordance with the present invention.
Figure 8:
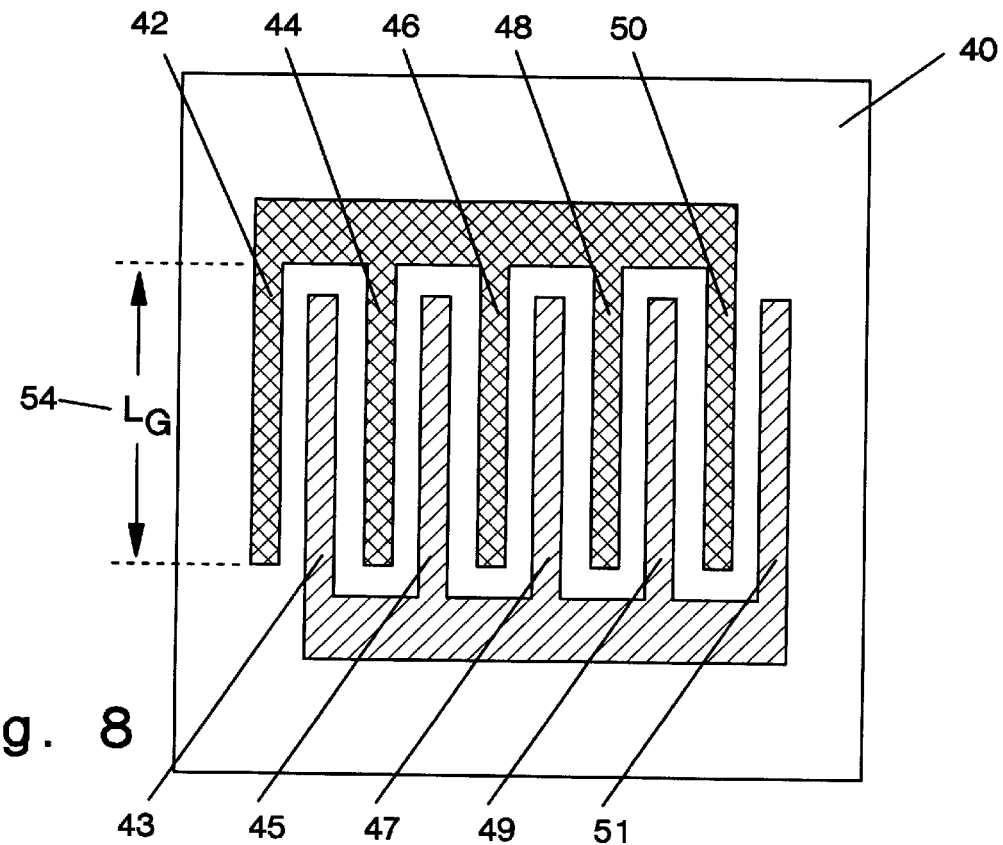
FIG. 8 is a schematic top view of the double barrier inter digital photo detector of FIG. 7.

Referring now to FIG. 7, there is shown an n-type semiconductor layer (40), such as Si or InGaAs, with a thickness in the order of 1 $\mu$m, epitaxially grown on a semi-insulating Si or GaAs substrate (41). The material InGaAs is an excellent candidate for the fabrication of the fast photo detectors with tailored photo response range. Interdigital metal grids (42–51) are deposited on the n-type semiconductor layer to form rectifying Schottky junctions. Between the metal grid (42) and the n-type semiconductor (40), there is a depletion region (42-1). A second depletion region (43-1) is present in the vicinity of a second metal grid (43). The spacing between adjacent metal grids (42,43) is in the order of microns, dependent on the semiconductor properties and the detector performance required. When light (52) falls on the semiconductor region (53) between the two metal grids (42,43) with a bias voltage applied between them, a photo current is generated which can be collected from the two metal grids. Under constant illumination, the amount of photo current is proportional to the width of the region (53) and the length of the metal grids (54) (see FIG. 8). In FIG. 8, it is shown that the width of and spacing between the metal grids (42–51) are kept constant and the spacing between two adjacent metal grids is also kept constant. Based on the above interdigital double detector, a detector pair can be constructed for the wavelength discrimination of fast pulses as described below.

Figure 9:
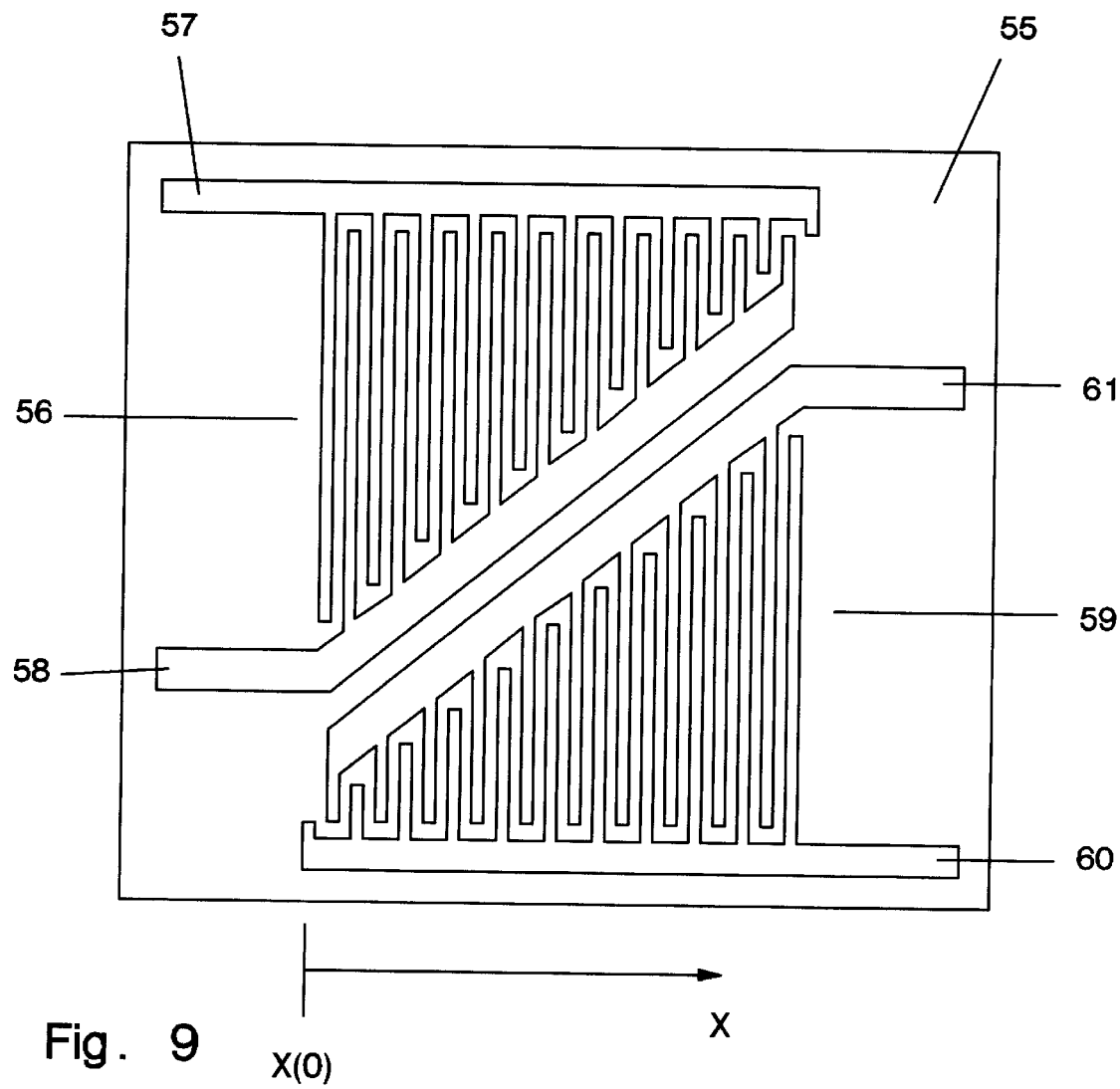
FIG. 9 is a schematic top view of an example embodiment of double barrier inter digital photo detector pair for laser wavelength discrimination in accordance with the present invention.

The preferred configuration of the detector pair using the double barrier structure fabricated on a semiconductor substrate (55) is shown in FIG. 9. One of the detectors (56) consists of two interdigital electrodes (57,58) with several fine fingers. Another detector (59) also consists of two interdigital electrodes (60,61) with several fine fingers. The length of the fingers for (56) decreases as one travels from the left to the right whereas it increases for (59). For clarity of illustration, the number of fingers in the two detectors has been reduced and the spacing increased. Since the area of active region decreases from left to right for (56) and increases for (59), the detector pair can be effectively used with a LVF for the wavelength discrimination.

Figure 10:
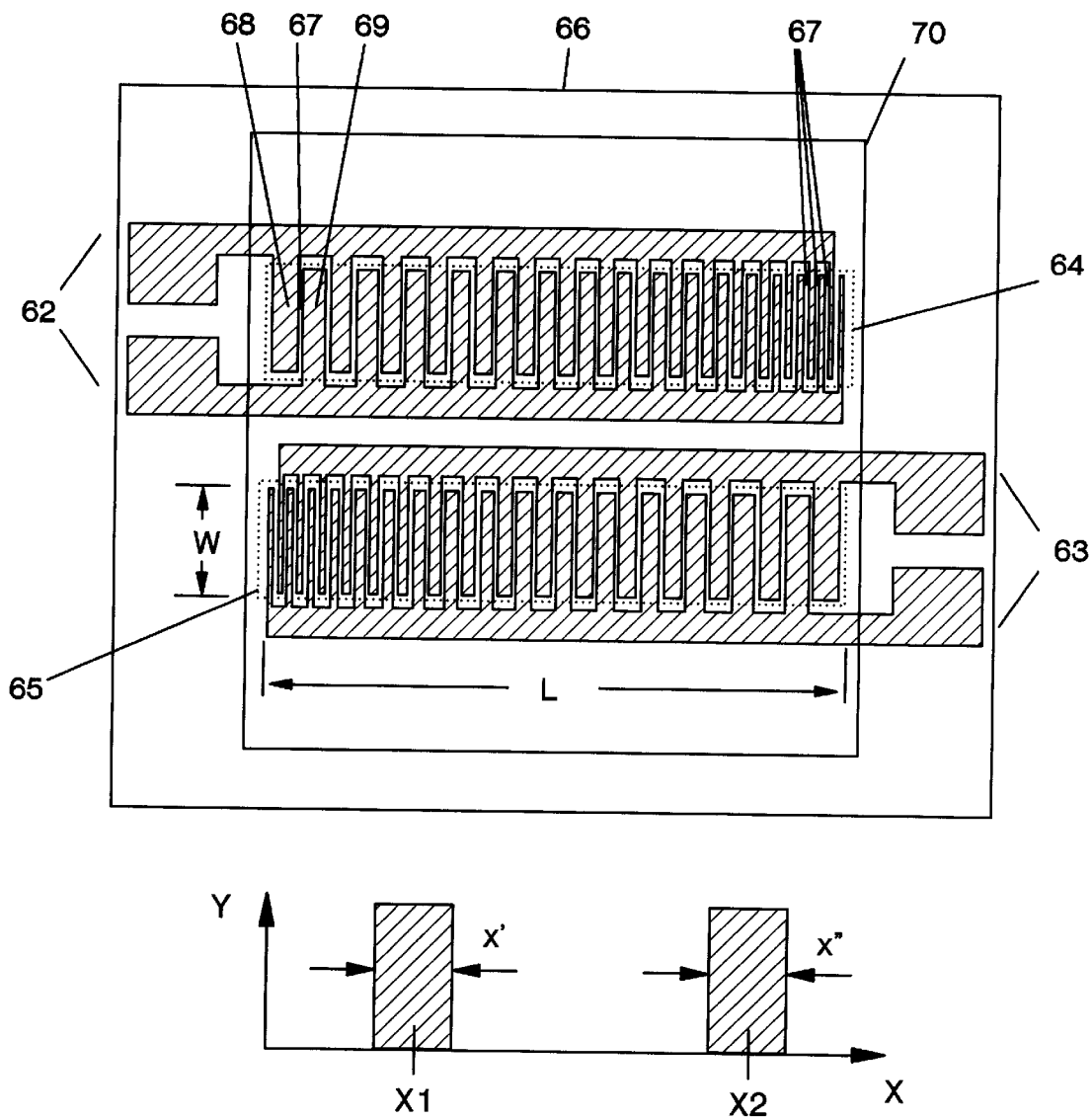
FIG. 10 is a schematic top view of a further embodiment of a double barrier inter digital photo detector pair, with different densities of active regions at different positions.

In addition to the different types of detector, the variation of detector photo current collection with position can also be obtained by using different structures. For instance, FIG. 10 shows a schematic top view of a double barrier interdigital photo detector pair for the wavelength discrimination. The structure shown consists of two interdigital detectors (62, 63). The two detectors are fabricated directly on n-type epitaxial semiconductor areas (64,65) respectively which are deposited on a semi insulating substrate (66). The thickness of the n-type epitaxial semiconductor regions is in the order of 1 $\mu$m. Unlike the structures shown in FIGS. 1 and 9, all of the metal fingers for the structure in FIG. 10 have the same length. With the constant metal finger length, the average area of active region, which determined the magnitude of the photo current, is proportional to the density of the active regions (67). It is noted that the width, W, of the two detectors is constant as X is varied.

The n-type semiconductor region (67) between two adjacent metal fingers (68,69) is the active region which is sensitive to incident light. For clarity of illustration, the number of fingers (68,69) in the two detectors has been reduced and the spacing (67) increased. When light falls on this region, photo carriers will be generated and collected by the two fingers. For the detector (62), the density of the active semiconductor regions increases from the left to the right. The active region density for the other detector (63) decreases from the left to the right. When a LVF (70) is installed on this detector pair in such a way that the wavelength for maximum transmission is constant in the Y-direction and increases in the X-direction, the detector unit thus formed can be used for wavelength discrimination. It is noted that the density of the active region for the detector (62) increases with distance, X, whereas the one for detector (63) decreases with X. When a light beam with short wavelength is incident on the detector unit, the light beam will be allowed to go through the LVF section centered at X1 with an effective width of x'. The photo current generated in detector (62) $I_{62}$, which is proportional to the average density of active regions (67) at X1, is small. The photo current generated in the other detector (63) due to the same light beam $I_{63}$, which is proportional to the average active region area at X1, is large.

The ratio of the two photo currents $I_{62}/I_{63}$ thus can be used to determine the position, X, of the LVF section which gives the maximum transmission of the incident light beam. From the position of the maximum transmission, the wavelength of the light beam is found. When a long wavelength light beam is incident on the detector unit, the light beam will be allowed to go through the LVF section centered at X2 with an effective width of x". This is because the wavelength of maximum transmission of the LVF increases with the increase of the distance, X. The photo current generated by the incident light beam in detector (62) $I_{62}$, which is proportional to the average density of active regions (67) at X2, is large. The photo current generated in detector (63) due to the same light beam $I_{63}$, which is proportional to the average active region area at X2, is small. The ratio of the two photo currents $I_{62}/I_{63}$ thus can be used to determine the position, X, of the LVF section which gives the maximum transmission of the incident light beam. From the position of the maximum transmission, the wavelength of the light beam is determined.

One of the advantages of the detector pair structure shown in FIG. 10 is that wavelength discrimination does not rely on the variation of the width of the detectors, W, with the distance, X. Therefore, the width W can be made small to allow more than one detector pair to be fabricated on the same substrate (66). All of the detector pairs then can be installed under the same LVF (70). Neutral attenuators with different transmission values can be mounted on different detector pairs to obtain a detector unit with a large dynamic power range.

In order to increase the sensitivity and resolution for the wavelength discrimination, the number of active regions (and thus the metal fingers) within the width x' for half of the maximum transmission ($T_{max}$) at a given wavelength must be large. This can be easily accomplished considering the relatively large value of x', in the order of mm for a practical LVF, and the relatively small widths of the metal grids and detector active regions. Metal grids and detector active regions (spacings between the grids) with widths in the order of 10 $\mu$m or less can be easily obtained using state of the art micro electronic fabrication technology. Therefore, a grid number of more than 10 can be conveniently achieved within the width x' for half of the maximum transmission ($T_{max}$) at the selected wavelength.

Figure 11:
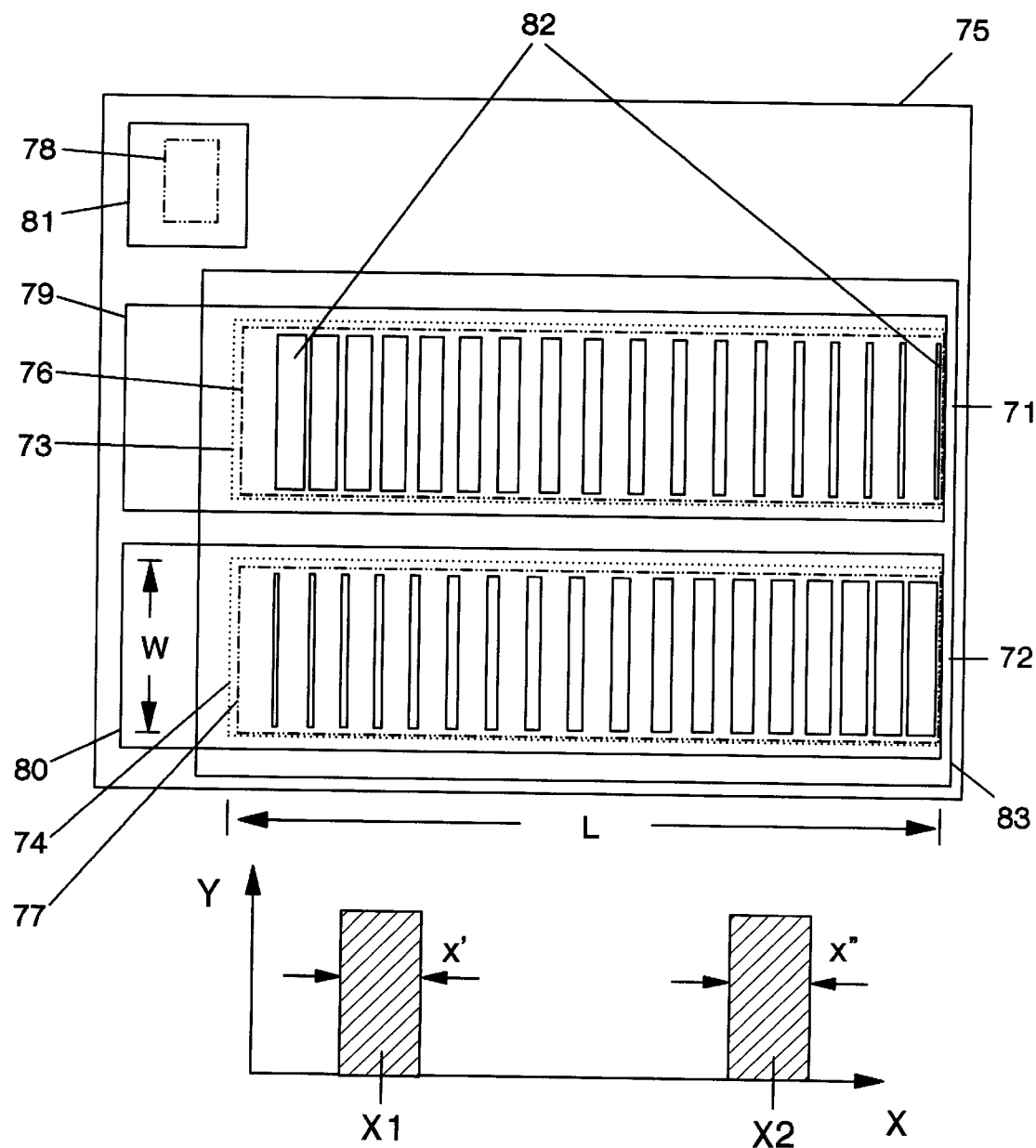
FIG. 11 is a schematic top view of a further embodiment of a p-n junction photo detector pair, having different width of active regions at different positions.

The detector pair structure described in FIG. 10 with the constant detector width, W, but with increasing or decreasing active area density can also be extended to the conventional p-n junction detector pair. FIG. 11 shows a schematic top view of a p-n junction photo detector pair for the wavelength discrimination. The structure shown consists of two p-n junction detectors (71,72). The two detectors are fabricated by first depositing a layer of insulating protecting material. Following this, two window areas (73,74) are cut and n-type dopants are allowed to diffuse to form the two n-type regions (73,74). Since the substrate (75) is p-type, a p-n junction is formed between area (73) and the substrate. Another junction is formed between area (74) and the substrate.

A new layer of insulating layer is grown over the entire surface. Three window are (76,77,78) are then cut to expose the semiconductor. A layer of ohmic contact metal such as Al (for Si) is then deposited. A photo lithography and etching process is finally carried out to remove unwanted metal areas and to create three metal regions (79,80,81). The metal region (81) is for the ohmic contact to the p-type substrate (75), whereas metal regions (79,80) are for electrical contacts to the two diffused n-type regions (73,74) respectively. In the metal regions (79,80), a number of rectangular windows (82) are created. For clarity of illustration, the number of rectangular windows (82) in the two detectors has been reduced and their width increased. In these rectangular window regions (82), the metal layer has been removed so that incident photons can reach the p-n junction to generate photo currents. These regions (82) thus constitute the active regions of the detector pair (71,72).

All of the rectangular regions (82) have the same length so that the average active area per unit distance, which determines the magnitude of the photo current, is proportional to the density of the active regions (82). It is noted that the width, W, of the two detectors is constant as X is varied. The n-type semiconductor regions (82), which are not covered by the metal layer (79,80), are the active regions and are sensitive to incident light. When light falls on these regions, photo carriers will be generated and collected by the metal contacts (79,80). For the detector (71), the density of the active semiconductor regions decreases from the left to the right. The active region density for the other detector (72) increases from the left to the right. When a LVF (83) is installed on this detector pair in such a way that the wavelength for maximum transmission is constant in the Y-direction and increasing in the X-direction, the detector unit formed can be used for the wavelength discrimination.

When a short wavelength light beam is incident on the detector unit, the light beam will be allowed to go through the LVF section centered at X1 with an effective width of x'. The photo current generated by the incident light beam in detector (71), $I_{71}$, which is proportional to the average density of active regions (82) at X1, is large, while the photo current generated in detector (72) due to the same light beam, $I_{72}$, which is proportional to the average active region area at X1, is small. The ratio of the two photo currents $I_{71}/I_{72}$ thus can be used to determined the position, X, of the LVF section which gives the maximum transmission of the incident light beam. From the position of the maximum transmission, the wavelength of the light beam is finally determined. When a long wavelength light beam is incident on the detector unit, the light beam will be allowed to go through the LVF section centered at X2 with an effective width of x". This is because the wavelength of maximum transmission of the LVF increases with the increase of the distance, X.

The photo current generated by the incident light beam in detector (71) $I_{71}$, which is proportional to the active area at X2, is small, while the photo current generated in detector (72) due to the same light beam $I_{72}$, which is proportional to the active area at X2, is large. The ratio of the two photo currents $I_{71}/I_{72}$ thus can be used to determine the position, X, of the LVF section which gives the maximum transmission of the incident light beam. From the position of the maximum transmission, the wavelength of the light beam is determined.

Similar to the double barrier detector pair with a constant width, W, one of the advantages of the detector pair structure shown in FIG. 11 is that wavelength discrimination of the incident light beam does not rely on the variation of the width of the detectors, W, with the distance, X. Therefore, the width W can be made small to allow more than one detector pair to be fabricated on the same substrate (75). All of the detector pairs then can be in stalled under the same LVF (83). Neutral attenuators with different transmission values can be mounted on different detector pairs to obtain a detector unit with a large dynamic power range.

Figure 12:
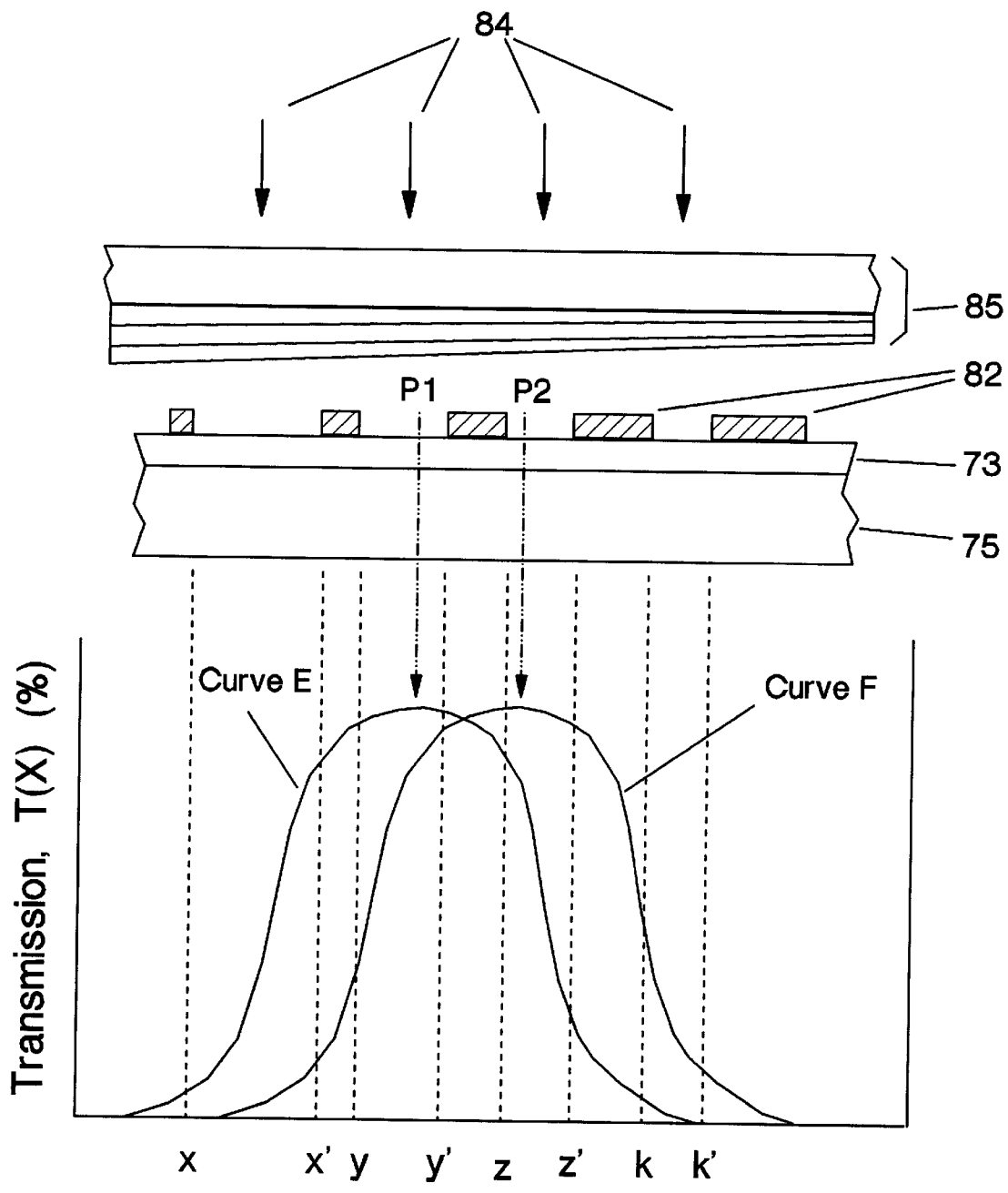
FIG. 12 is a diagram showing the effect of shift of wavelength on the photo current collection for one of the detectors of the detector pair in FIG. 11, having a photo sensitive area the width of which increases with distance.

A high wavelength discrimination resolution can be obtained using the detector pair in the present invention even without the use of a LVF with very high wavelength resolution. The wavelength resolution is obtained in the present invention by reducing the spacings of adjacent photo sensitive active regions in the two detectors. Since the effective area of the photo sensitive regions is a function of distance, X, even a small shift in wavelength of the incident monochromatic light pulse may be detected. Reference is now made to FIG. 12, where there is shown, for illustrative purposes, the distribution of photo sensitive regions for a section of the detector (71) given in FIG. 11.

When a monochromatic light (84) with a wavelength, w, is incident on the LVF, the light will be allowed to transmit through the in a section of the LVF in the vicinity of (P1), where the maximum transmission wavelength is equal to w. At this wavelength w, the transmission of the LVF, T(X), is given by curve E as a function of distance X. The total number of photo generated carriers which can be detected between the metal contact (82) and the semiconductor substrate (75) is proportional to integral of the transmission values given by Curve E in the four active regions with distance, from x to x', y to y', z to z' and k to k'. As the wavelength of the incident monochromatic light beam is shifted by a value of dw, then the transmission curve of the LVF also shifts to Curve F, with the maximum transmission shifted to P2. When the density of photons in the two beams is same, the total number of photo carriers generated is now proportional to integral of the transmission values given by Curve F in the four active regions with distance, from x to x', y to y', z to z' and k to k'. Since the transmission curve has shifted to the right with the shift of the wavelength, the photo generated charge carriers by the light beam at wavelength, w, will be smaller than that from the light beam at wavelength w+dw. This is due to the progressively decreasing width of the active detector regions (x–x')>(y–y')>(z–z')>(k–k'), which results in a reduced number of photo excited charge carriers when the wavelength is shifted from w to w+dw.

Figure 13:
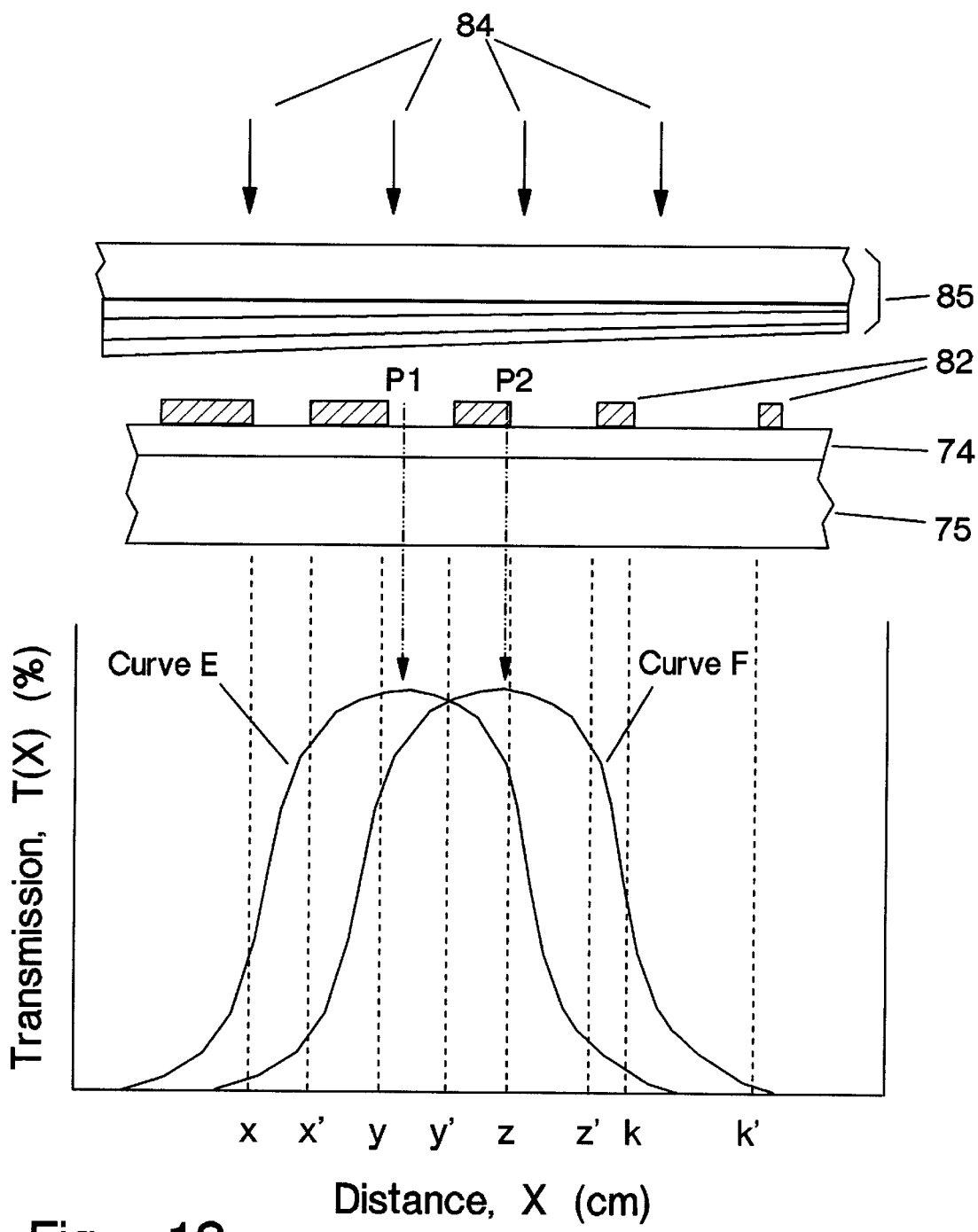
FIG. 13 is a diagram showing the effect of shift of wavelength on the photo current collection for the other detector of the pair of FIG. 11, having photo sensitive area the width of which decreases with distance.

The change of the photo current in the other detector (72) of the detector pair shown in FIG. 11 due to the same shift of wavelength from w to w+dw of the incident light is just opposite. To illustrate this opposite change, a diagram similar to the one shown in FIG. 12 is given in FIG. 13, except that the width of active photo sensitive regions increases from the left to the right. Since the effective area of the photo sensitive regions is a function of distance, X, even a small shift in wavelength of the incident monochromatic light pulse will result in a change of the photo current. As shown in FIG. 13, when the monochromatic light (84) with a wavelength, w, is incident on the LVF, the light will be allowed to transmit through the LVF section in the vicinity of (P1), where the maximum transmission wavelength is equal to w. At this wavelength w, the transmission of the LVF, T(X), is given by curve E as a function of distance X. The total number of photo generated carriers generated is proportional to integral of the transmission values given by Curve E in the four active regions with distance, from x to x', y to y', z to z' and k to k'. As the wavelength of the incident monochromatic light beam is shifted by a value of dw, the transmission curve of the LVF also shifts to Curve F, with the maximum transmission shifted to P2.

When the density of photons in the two beams is same, the total number of photo generated carriers is now proportional to integral of the transmission values given by Curve F in the four active regions with distance, from x to x', y to y', z to z' and k to k'. Since the transmission curve has shifted to the right with the shift of the wavelength, the photo generated charge carriers by the light beam with wavelength, w, is greater than that from the light beam with wavelength w+dw. This is due to the progressively increasing width of the active detector regions (x–x')<(y–y')<(z–z')<(k–k'), which results in an increased number of photo excited charge carriers when the wavelength is shifted from w to w+dw.

Figure 14:
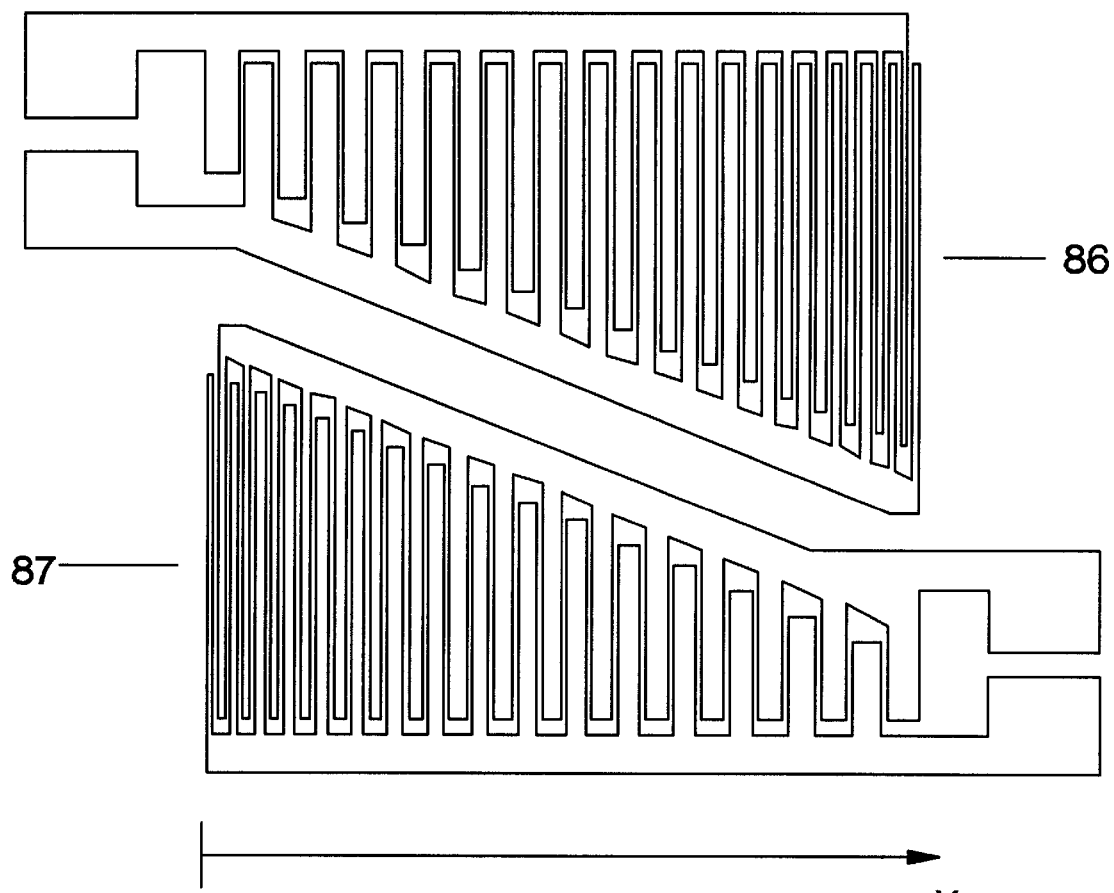
FIG. 14 is a schematic top view of a further embodiment of double barrier inter digital photo detector pair, with different densities of active regions and different finger lengths at different positions.

The resolution for the wavelength discrimination can be further improved by incorporating the structure with a continuously increasing or decreasing length of the photo sensitive active regions as shown in FIG. 14. Here, it is noted that for the detector 86, both the length and density of fingers increase in the X direction. Therefore, the number of photo excited carriers in the right-hand region under a given illumination will be much greater than that in the left-hand region. Conversely, both length and density of fingers for detector (87) decrease with the increase in X, therefore, the number of photo excited carriers in the right hand region under a given illumination will be much smaller than that in the left hand region. The resulting ratio of photo currents under monochromatic illumination through a LVF will be more sensitive to the change of the wavelength and the resolution is increased.

It is also noted that in order to minimize light straying from the incident beam and increase the resolution for wavelength discrimination, the filter ((85) in FIG. 13 or (17) in FIG.3)) must be in contact with the detector pair. In addition to the contact of the LVF with the detector pair, it is preferred to install the LVF so that the multi layer filter coating (28) in FIG. 3 is facing towards the active regions of the detectors. This is done in order to reduce further the distance between the multi layer coating of the LVF and the surface of active regions of the detectors.

Figure 15:
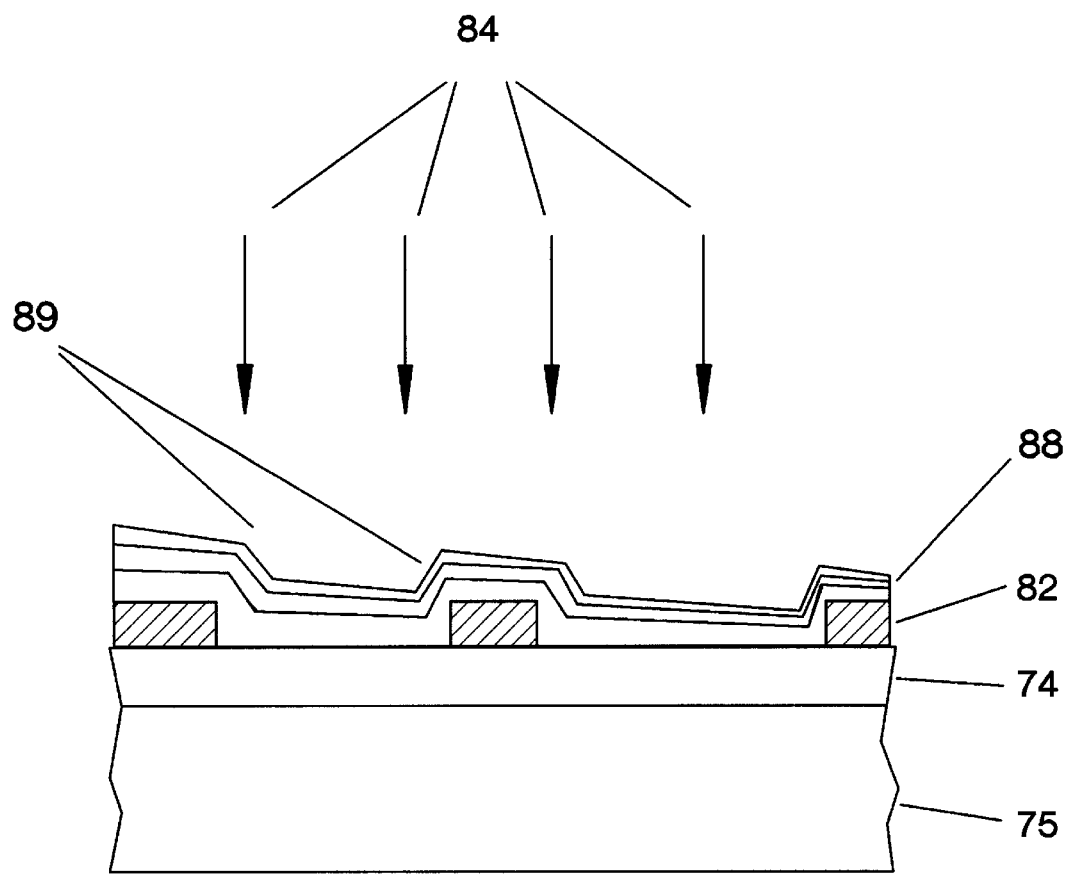
FIG. 15 is a schematic top view of part of one of the p-n junction photo detectors shown in FIG. 11 with a LVF layer deposited directly on the surface after the metal grid formation.
Figure 16:
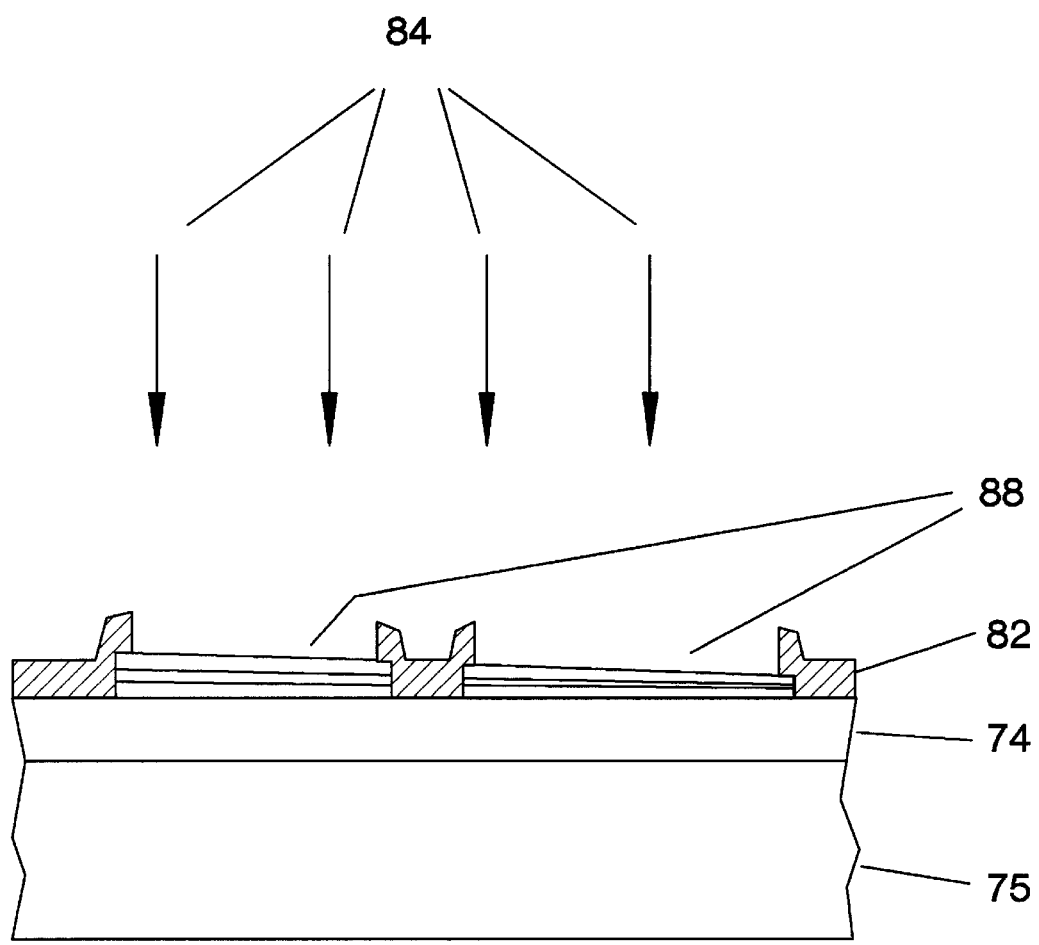
FIG. 16 is a schematic top view of part of one of the p-n junction photo detectors shown in FIG. 11 with a LVF layer deposited directly on the surface before the metal grid formation.

Another method of constructing the detector unit with a detector pair and a LVF for the wavelength discrimination is to deposit the multi layer LVF directly on the surface of the detector pair. FIG. 15 shows a schematic cross-sectional view of a section of the detector with the multi layer LVF. After the diffusion, metal deposition and etching processes to form the diffused region (74) and grid contacts (82) on the semiconductor substrate (75), a multi layer LVF (88) is deposited over the entire detector surface. The number of layers, materials and thickness variation of each layer of the LVF are selected according to the variation of the maximum transmission wavelength. With the multi layer LVF directly deposited on the detector surface, the error of wavelength discrimination will be reduced further. In this structure, it is noted that the thickness distribution of the multi layer coating in the regions (89) near the metal grids (82) is not uniform due to the presence of the metal grids. This may cause a shift of maximum transmission wavelength in these regions. In order to eliminate the non uniform thickness distribution, the multi layer LVF may be coated before the deposition and etching of the metal grids. A schematic cross-sectional view of a section of such a detector is shown in FIG. 16. Here, the multi layer LVF (88) is deposited after the diffusion process which forms region (74). After the deposition of the LVF, it is selectively etched to open windows for the metal grids (82). A layer of photo resist is then spun-coated over the entire surface and patterned to form windows for the metal grids. A layer of ohmic contact metal is evaporated and the unwanted metal areas are removed with the remained photo resist by immersing in a solvent, such as acetone. In order to obtain continuous variation of wavelength for the maximum transmission, each metal grid (82) overlaps the multi layer coating regions on both sides. This structure is especially useful for the double barrier detector pair where the width of active regions (separation between two adjacent metal grids) is usually small.

It is important to note that all detector regions adjacent to the filter will have to be covered by an opaque material such as blackened metal foil or plastic sheet during the operation. This is required in order to prevent unwanted light from straying into the active regions of the detectors and thus to reduce the false signals.

Given below are some illustrative examples for the invention. It is understood they are nonlimitative as far as the spirit and principle of this invention are concerned.

EXAMPLE 1

Wavelength Discrimination Junction Detector

A layer of $SiO_2$ with a thickness of about 1 $\mu$m is thermally grown at 1100° C. for 4 hours in an environment containing oxygen and water vapour on a polished p-type Si wafer. Resistivity of the p-type Si wafer is about $10^{15}$ cm$^{-3}$. Two triangular n-type regions (base 10 mm and height 4 mm) and a rectangular region (base width 0.5 mm and height 0.4 mm) are then diffused into the front surface of the wafer. Before the diffusion, the two triangular regions and the rectangular region are created using conventional oxidation process and photo lithography process with the first mask. The rectangular region is for the fabrication of a trigger detector which will not be covered by the LVF. One of the triangular regions is an inverted mirror image of the other with the separation between them to be 100 $\mu$m. The diffusion is carried out at 900° C. for 2 hours using a phosphorous source, yielding junctions with a depth of about 0.7 $\mu$m. After the diffusion, the wafer is briefly etched in a buffered HF solution and then a new layer of $SiO_2$ is grown on the surface. This is carried out at 1100° C. for 1 hour in a quartz chamber with flowing oxygen containing water vapour. After the new oxidation, two new triangular windows and a new rectangular region are patterned (using a second mask) and $SiO_2$ is etched from within the previous triangular and rectangular windows for the diffusion. The separation between the each window and one of the corresponding windows for diffusion is about 50 $\mu$m.

An Al film with a thickness of 1 $\mu$m is thermally evaporated over the entire surface and then patterned and etched using a third mask to create three metal contact areas. After this, another layer of Al with a thickness of 1 $\mu$m is evaporated on back side of the wafer for contact to the p-type Si substrate. On the front surface, one of the three contacts is for the trigger detector and the other two for the detector pair. Each metal contact for the detector pair contains 180 metal grids which are perpendicular to the base of the triangular region. All of the grids fall inside the triangular diffused n-type region with a base length of 10 mm. For one of the triangular region, the length of the grids increases from 10 $\mu$m to 3800 $\mu$m going from the narrow end to the wide end of the base. The incremental length step between adjacent grids is 21 $\mu$m. The width of the grids (along the base) is 10 $\mu$m so that the width of active regions, which is equal to the separation of two adjacent grids is 40 $\mu$m. The effective active area per unit distance in the base direction of the detector is thus a linear function of the distance (increases with distance). For the other triangular region, the total number of grids is also 180. The length of the grids decreases from 3800 $\mu$m to 10 $\mu$m going from the wide end to the narrow one of the base with a decremental length step between adjacent grids to be 21 $\mu$m. The width of the grids (along the base) is 10 $\mu$m so that the width of active regions, which is equal to the separation of two adjacent grids is 40 $\mu$m. The effective active area per unit distance in the base direction of the detector is thus a linear function of the distance (decreases with the distance).

In the rectangular region, the total number of grids is 80 with their length equal to 3800 $\mu$m. The width of the grids (along the base) is 10 $\mu$m so that the width of active regions, which is equal to the separation of two adjacent grids is 40 $\mu$m. This rectangular detector is used as the trigger detector for sample and hold circuits which are used for data acquisition.

EXAMPLE 2

Wavelength Discrimination Double Barrier Detector

A rectangular semi insulating GaAs substrate with a layer of n-type InGaAs deposited on it is used as the starting substrate (dimensions 10×15×1 mm$^3$). The thickness of the InGaAs is about 2 $\mu$m and the doping concentration about $10^{14}$ cm$^{-3}$. Two triangular n-type regions (base 10 mm and height 4 mm) and a rectangular region (width 0.5 mm and height 0.4 mm) are created using conventional photo lithography process and etching process with the first mask. The n-type material in areas around the two triangular regions and the rectangular region are completely etched away in order to achieve electrical isolation between the two triangular regions and the rectangular region. The rectangular region is for the fabrication of a trigger detector. One of the triangular regions is an inverted mirror image of the other and the separation between them is 100 $\mu$m. An Al film with a thickness of 1.5 $\mu$m is evaporated over the entire surface and then patterned and etched using a second mask to create two rectifying metal contact areas for the two triangular regions and one in the rectangular region. Each rectifying metal contact area for the triangular detector pair contains 490 inter digital metal grids which are perpendicular to the base of the triangular region. All of the grids fall inside the triangular n-type region or can extend slightly beyond the region. For one of the rectifying contact areas in the first triangular region, all of the 245 grids are connected to a horizontal Al line (width about 50 $\mu$m) along the base. For the other rectifying contact area in the same triangular region, all of the 245 grids are connected to an inclined Al line (width about 50 $\mu$m). The horizontal Al line forms the first electrode while the inclined Al line forms the second electrode for the detector. The width of the metal grids is 18 $\mu$m and the separation between adjacent grids is 2 $\mu$m. The length of grids increases from 10 $\mu$m to 3800 $\mu$m going from the narrow end to the wide end of the base. The incremental length step between adjacent grids is 8.4 µm. The width of the active regions, which is equal to the separation of two adjacent grids, is equal to 2 µm. The effective active area per unit distance in the base direction of the detector is thus a linear function of the distance (increases with the increase of distance).

For one of the rectifying contact areas in the second triangular region, all of the 245 grids are connected to a horizontal Al line (width about 50 µm) along the base. For the other rectifying contact area in the same triangular region, all of the 245 grids are connected to an inclined Al line (width about 50 µm). The width of the metal grids is 18 µm and the separation between adjacent grids is 2 µm. The length of grids decreases from 3800 µm to 10 µm going from the wide end to the narrow end of the base. The decremental length step between adjacent grids is 8.4 µm. The width of the active regions, which is equal to the separation of two adjacent grids is equal to 2 µm. The horizontal Al line forms the first electrode while the inclined Al line forms the second electrode for the detector. The effective active area per unit distance in the base direction of the detector is thus a linear function of the distance (decreases with the increase of distance).

In the rectangular region, the total number of grids is 244 with their length equal to 3800 µm. The width of the grids (along the base) is 18 µm and the width of active regions, which is equal to the separation of two adjacent grids is equal to 2 µm. Among the 244 grids, 122 are connected to an upper Al line and the rest connected to a bottom Al line. The upper Al line forms the first electrode while the bottom Al line forms the second electrode for the trigger detector. This rectangular detector is used as the trigger detector for the sample and hold circuits.

EXAMPLE 3

Wavelength Discrimination Circuit

An electronic circuit to be used with a wavelength discriminating detector described in Example 1 or 2 is given here. A LVF obtained from Optical Coating Laboratory, Inc. for the wavelength range of 0.6 to 1.1 µm with a half transmission band width of about 0.05 µm is installed directly on the active regions of the detector pair. The orientation of the LVF is adjusted so that the wavelength for maximum transmission varies along the direction of base of the detector pair (in the same direction where length of metal grids increases or decreases). Except for the trigger detector, all other areas of the detector pair outside the active and metal contact regions are covered by an opaque paper mask. The output of the trigger detector is connected to a first operational amplifier and the amplified output is connected to two sample and hold chips (BURR-BROWN SHC5320 Sample/hold Amplifier). Output signals of the detectors are fed to the two sample and hold chips respectively. Electric filters in a form of RC circuits are included in order to minimize the low frequency noises induced either in the detectors or the circuits. Output voltages from the two sample and hold circuits are checked on a repetitive basis by a micro computer PC AT through a MetraByte's DAS-4 8 channel high speed A/D and digital I/O board. A software written in Basic is used to sense the voltages from the two sample and hold circuits at a repetition rate of about 100 times per second. When the detectors are illuminated by a pulsed monochromatic light, signals will be generated in the trigger detector and the detector pair as well. When the amplified voltage from the trigger detector exceeds a value of 0.8 V, it will trigger the sample and hold circuits to sample and hold signals from the two detectors. As one of the voltages is greater than 0.06 volt (which is substantially greater than the noise level of the detectors and the amplifier circuits), voltage values from the two sample and hold circuits (which are connected respectively to the two detectors in the pair) are then stored in memory of the PC. Ratio of the two voltages is taken and compared to the calibration data of the LVF and detector which have been stored in the memory to determine the wavelength of the incident light. Finally, the wavelength of the incident light beam is indicated on the monitor.

The foregoing description is illustrative of the principles of the present invention. Numerous extensions and modifications thereof would be apparent to the person skilled in the art. Therefore, all such extensions and modifications are to be considered to be within the scope and spirit of the present invention.

The embodiments of the invention in which an exclusive property or privilege is claimed are defined as follows:

1. A method for fabrication at least one pair of a first junction photo detector and a second junction photo detector for detection and wavelength discrimination of a monochromatic light beam comprising the steps of:

depositing a first electrically insulating layer over a front surface of a semiconductor substrate of one conduction type;

removing selectively said first electrically insulating layer from at least a pair of polygon areas on surface of said semiconductor substrate;

diffusing impurities into said polygon areas of semiconductor substrate to form active areas of another conduction type for said first and second junction photo detectors;

depositing a second electrically insulating layer over said front surface;

removing selectively said second electrically insulating layer from said polygon areas and at least a region on surface of said substrate;

depositing a layer of ohmic contact metal over surface of said substrate and polygon areas;

removing selectively said layer of ohmic metal to form at least an ohmic contact to said substrate and ohmic contacts each with fingers in said polygon areas, regions between adjacent fingers forming photo sensitive elements of said detectors, area per unit distance of said photo sensitive elements of said first detector increasing in one direction, while area per unit distance of said photo sensitive elements of said second detector decreases with distance in said direction; and attaching electrical wires to ohmic contact to said substrate and ohmic contacts to said polygon areas.

2. A method for fabrication of junction photo detectors for detection and wavelength discrimination of a light beam as claimed in claim 1, wherein spacing between adjacent fingers is constant and the length of said fingers of the first detector in said pair increases in one direction, the length of said fingers of the second detector in said pair decreases in said direction, area per unit distance of photo sensitive active regions, between adjacent fingers, of said first detector increasing in said direction while area per unit distance of photo sensitive active regions of said second detector in said pair decreases in said direction.

3. A method for fabrication of junction photo detectors for detection and wavelength discrimination of a light beam as claimed in claim 1, wherein length of said fingers is constant and spacing between adjacent fingers in said first detector increases in one direction, spacing between said adjacent fingers of the second detector decreases in said direction, area per unit distance of photo sensitive active regions, between adjacent fingers, of said first detector increasing in said direction while area per unit distance of photo sensitive active regions of said second detector in said pair decreases in said direction.

4. A method for fabrication of junction photo detectors for detection and wavelength discrimination of a light beam as claimed in claim 1, wherein length of said fingers in said first detector increases in one direction, spacing between adjacent fingers also increases in said direction, length of said fingers in said second detector decreases in said direction while spacing between adjacent fingers also decreases in said direction, area per unit distance of photo sensitive active regions, between adjacent fingers, of said first detector increasing in said direction while area per unit distance of photo sensitive active regions of said second detector in said pair decreases in said direction.

5. A method for fabrication of junction photo detectors for detection and wavelength discrimination of a light beam as claimed in claim 1, further comprising a step of forming a trigger detector out side said polygon areas on said substrate.

6. A method for fabrication of junction photo detectors for detection and wavelength discrimination of a light beam as claimed in claim 1, further comprising a step of forming at least one semiconductor layer between said substrate and said diffused layer, said semiconductor layer having a resistivity at least 100 times greater than resistivity for said substrate to enhance generation of said photo current.

7. A method for fabrication of junction photo detectors for detection and wavelength discrimination of a light beam as claimed in claim 1, further comprising a step of depositing a variable filter on said substrate, the maximum wavelength of transmission of said variable filter varying in said direction.

8. A method for fabrication of junction photo detectors and variable filter for detection and wavelength discrimination of a light beam as claimed in claim 7, wherein wavelength range of maximum transmission for said variable filter is not greater than photo response wavelength range of said first photo detector and said second photo detector.

9. A method for fabrication of at least one pair of a first double barrier photo detector and a second double barrier photo detector for detection and wavelength discrimination of a light beam comprising the steps of:

removing selectively a thin conducting semiconductor layer on a semiconductor substrate to form at least a pair of polygon areas for said first double barrier photo detector and said second double barrier photo detector, on front surface of said semiconductor layer;

depositing a layer of metal over surface of said substrate and polygon areas, said layer of metal forms Schottky contacts to said thin conducting semiconductor layer;

removing selectively said layer of metal to form at least one pair of contacts each with fingers in said polygon areas, regions between adjacent fingers form photo sensitive elements of said detectors, area per unit distance of said photo sensitive elements of said first detector increasing in one direction, while area per unit distance of said photo sensitive elements of said second detector decreases with distance in said direction; and attaching electrical wires to contacts of said polygon areas.

10. A method for fabrication of double barrier photo detectors for detection and wavelength discrimination of a light beam as claimed in claim 9, wherein spacing between adjacent fingers is constant and length of said fingers of the first detector in said pair increases in one direction, length of said fingers of the second detector in said pair decreases in said direction, area per unit distance of photo sensitive active regions, between adjacent fingers, of said first detector increasing in said direction while area per unit distance of photo sensitive active regions of said second detector in said pair decreases in said direction.

11. A method for fabrication of double barrier photo detectors for detection and wavelength discrimination of a light beam as claimed in claim 9, wherein length of said fingers and spacing between adjacent fingers are constant, width of fingers in said first detector increases in one direction, while width of fingers of the second detector decreases in said direction, area per unit distance of photo sensitive active regions, defining by adjacent fingers, of said first detector decreasing in said direction while area per unit distance of photo sensitive active regions of said second detector in said pair increases in said direction.

12. A method for fabrication of double barrier photo detectors for detection and wavelength discrimination of a light beam as claimed in claim 9, wherein spacing between adjacent fingers are constant, length of said fingers decreases in one direction and width of said fingers increases in said first detector, while length of fingers increases in said direction, width of said fingers decreases in said second detector decreases, area per unit distance of photo sensitive active regions, defining by adjacent fingers, of said first detector decreasing in said direction while area per unit distance of photo sensitive active regions of said second detector in said pair increases in said direction.

13. A method for fabrication of double barrier photo detectors for detection and wavelength discrimination of a light beam as claimed in claim 9, further comprising a step of forming a trigger detector out side said polygon areas.

14. A method for fabrication of double barrier photo detectors for detection and wavelength discrimination of a light beam as claimed in claim 10, further comprising a step of depositing a variable filter on said substrate, maximum wavelength of transmission of said variable filter varies in said direction.

15. A method for fabrication of double barrier photo detectors and variable filter for detection and wavelength discrimination of a light beam as claimed in claim 14, wherein wavelength range of maximum transmission for said variable filter is not greater than photo response wavelength range of said first photo detector and said second photo detector.

16. A method for fabrication of double barrier photo detectors for detection and wavelength discrimination of a light beam as claimed in claim 9, wherein said substrate semi insulating material has a high resistivity.

* * * * *